United States Patent [19]
Evans et al.

[11] Patent Number: 5,864,932
[45] Date of Patent: *Feb. 2, 1999

[54] PARTIALLY OR COMPLETELY ENCAPSULATED TOP ELECTRODE OF A FERROELECTRIC CAPACITOR

[75] Inventors: Thomas A. Evans; George Argos, Jr., both of Colorado Springs, Colo.

[73] Assignee: Ramtron International Corporation, Colorado Springs, Colo.

[*] Notice: This patent issued on a continued prosecution application filed under 37 CFR 1.53(d), and is subject to the twenty year patent term provisions of 35 U.S.C. 154(a)(2).

[21] Appl. No.: 728,740

[22] Filed: Oct. 11, 1996

Related U.S. Application Data

[63] Continuation-in-part of Ser. No. 700,076, Aug. 20, 1996.
[51] Int. Cl.⁶ ........................................... H01G 7/00
[52] U.S. Cl. ......................................... 29/25.42; 361/313
[58] Field of Search ................................... 29/25.42, 854; 361/313; 365/145; 427/80

[56] References Cited

U.S. PATENT DOCUMENTS

| | | |
|---|---|---|
| 4,700,457 | 10/1987 | Matsukawa . |
| 4,860,254 | 8/1989 | Pott et al. . |
| 5,031,144 | 7/1991 | Persky . |
| 5,119,154 | 6/1992 | Gnadinger . |
| 5,122,477 | 6/1992 | Wolters et al. . |
| 5,155,573 | 10/1992 | Abe et al. . |
| 5,192,704 | 3/1993 | McDavid et al. . |
| 5,206,788 | 4/1993 | Larson et al. .......................... 29/25.42 |
| 5,212,620 | 5/1993 | Evans et al. .......................... 29/25.42 |
| 5,273,927 | 12/1993 | Gnadinger . |
| 5,293,075 | 3/1994 | Onishi et al. . |
| 5,303,186 | 4/1994 | Yamauchi . |
| 5,350,705 | 9/1994 | Brassington et al. . |
| 5,371,700 | 12/1994 | Hamada . |
| 5,375,085 | 12/1994 | Gnade et al. . |
| 5,382,817 | 1/1995 | Kashihara et al. . |
| 5,383,150 | 1/1995 | Nakamura et al. . |
| 5,390,143 | 2/1995 | Manning . |
| 5,396,095 | 3/1995 | Wolters et al. . |
| 5,416,735 | 5/1995 | Onishi et al. . |
| 5,438,023 | 8/1995 | Argos, et al. . |
| 5,440,173 | 8/1995 | Evans, Jr. et al. . |
| 5,475,248 | 12/1995 | Takenaka . |
| 5,479,316 | 12/1995 | Smrtic et al. .......................... 29/25.42 |
| 5,481,490 | 1/1996 | Wantanabe et al. . |

OTHER PUBLICATIONS

Chapman, S. P., et al., "Tuning PZT Do Fabrication Processes by Optimizing Imprint", abstract, Ninth International Symposium on Integrated Ferroelectrics, Santa Fe, New Mexico, Mar. 3, 1997.

Kim, D., et al., "MOCVD Growth and Characterization of PZT Thin Films", abstract, Ninth International Symposium on Integrated Ferroelectrics, Santa Fe, New Mexico, Mar. 3, 1997.

Kim, D., et al, "Effects of Substrate Modifiation on the Growth and Characteristics of MOCVD PZT", pp. 67–79, Ninth International Symposium on Integrated Ferroelectrics, Santa Fe, New Mexico, Mar. 3, 1997.

*Primary Examiner*—Linda Johnson
*Attorney, Agent, or Firm*—Peter J. Meza, Esq.

[57] ABSTRACT

A ferroelectric capacitor includes a bottom electrode, a top electrode, and a ferroelectric layer located between the top and bottom electrodes that extends to completely encapsulate the top electrode, except for a contact hole to allow metalization of the top electrode. The total encapsulation of the top electrode reduces the sensitivity of the ferroelectric capacitor to hydrogen and thus improves electrical switching performance.

10 Claims, 19 Drawing Sheets

5,864,932

PARTIALLY OR COMPLETELY ENCAPSULATED TOP ELECTRODE OF A FERROELECTRIC CAPACITOR

RELATED APPLICATIONS

The present application is a continuation-in-part of co-pending patent application Ser. No. 08/700,076 for "Partially Or Completely Encapsulated Top Electrode Of A Ferroelectric Capacitor", filed Aug. 20, 1996.

FIELD OF THE INVENTION

This invention relates generally to ferroelectric capacitors. More particularly, the present invention relates to a technique and structure for preventing degradation in the electrical performance of ferroelectric capacitors.

BACKGROUND OF THE INVENTION

A portion of a prior art integrated circuit ferroelectric memory cell 10 including a transistor and a ferroelectric capacitor is shown in FIG. 1. A silicon or other substrate 12 includes a diffused region 14, which forms part of a transistor used in the memory cell. A thick oxide layer 16 forms the substrate for the ferroelectric capacitor. The thick oxide layer 16 is patterned and etched to allow access to diffused region 14. The ferroelectric capacitor includes a platinum bottom electrode 18, a ferroelectric layer 20, typically PZT (lead zirconate titanate), and a platinum top electrode 22. A subsequent oxide layer 24 is deposited, which is patterned and etched, to provide access to diffused region 14, bottom electrode 18, and to top electrode 22. A local interconnect layer 26 is deposited, patterned and etched, to provide a local interconnect 26A between top electrode 22 and diffused region 14, as well as metalization 26B for bottom electrode 18.

It is well known in the ferroelectric arts that certain ferroelectric materials, particularly PZT, are susceptible to degradation of electrical switching performance if exposed to hydrogen. One source of hydrogen can be found in the plastic packaging materials often used with integrated circuits. Another source of hydrogen can be found in the various oxide layers used in fabricating the ferroelectric capacitor or memory cell.

A section 28 of memory cell 10 is shown in greater magnification in FIG. 2 to illustrate the problem of hydrogen sensitivity that exists within the prior art memory cell. Section 28 shows oxide layer 16, bottom electrode 18, ferroelectric layer 20, top electrode 22, oxide layer 24, and local interconnect 26A. Note particularly in FIG. 2 that there is an interface between oxide layer 24 and ferroelectric layer 20. The interface extends along the top surface and sides of ferroelectric layer 20. During and after fabrication, hydrogen is generated within oxide layer 24, which in turn is gradually absorbed by ferroelectric layer 20. The arrows shown in FIG. 2 show generally the probable path of hydrogen diffusion into the ferroelectric layer 20. Studies have shown that exposure to hydrogen gradually degrades the amount of switching charge produced by the ferroelectric capacitor. Over time, the exposure to hydrogen may destroy electrical switching performance altogether.

What is desired, therefore, is a technique and structure to reduce hydrogen sensitivity in an integrated ferroelectric capacitor.

SUMMARY OF THE INVENTION

It is, therefore, a principal object of the present invention to improve the electrical switching performance of integrated circuit ferroelectric capacitors by reducing sensitivity to hydrogen.

It is another object of the invention to improve the performance of ferroelectric memory circuits.

It is an advantage of the invention that the fabrication methods set forth are generally compatible with existing ferroelectric capacitor and ferroelectric memory fabrication methods.

It is another advantage of the invention that the capacitor fabricated as set forth herein can be used in a wide array of electronic products such as integrated circuit memories and other integrated circuits, RF/ID integrated circuits and cards, discrete devices, or any application in which improved electrical switching performance and resistance to hydrogen diffusion is desired.

According to a first general embodiment of the present invention, a ferroelectric capacitor includes a bottom electrode, a top electrode, and a ferroelectric layer located between the top and bottom electrodes that extends to completely encapsulate the top electrode, except for a contact hole to allow metalization of the top electrode. The total encapsulation of the top electrode reduces the sensitivity of the ferroelectric capacitor to hydrogen and thus improves electrical switching performance.

According to a second general embodiment of the present invention, a ferroelectric capacitor includes a bottom electrode and a ferroelectric layer formed on the bottom electrode. The ferroelectric layer is partially etched to form an indentation to receive a top electrode. A dielectric layer is formed over the ferroelectric layer, and includes a contact hole to allow metalization of the top electrode. The partial encapsulation of the top electrode also reduces the sensitivity of the ferroelectric capacitor to hydrogen.

The ferroelectric layer in the capacitor can be fabricated using PZT, SBT, or other known ferroelectric materials. The ferroelectric capacitor can then be used in conjunction with a transistor to form a memory cell in an array of such cells.

A first method of fabricating a ferroelectric capacitor according to the present invention includes the steps of: forming in sequence a bottom electrode layer, a first ferroelectric layer, and a top electrode layer; etching the top electrode layer to form a top electrode; forming a second ferroelectric layer over the first ferroelectric layer, thereby completely encapsulating the top electrode; etching the second ferroelectric layer; etching the first ferroelectric layer and the bottom electrode layer to form a bottom electrode; forming a dielectric layer over the etched first ferroelectric and second ferroelectric layers; etching a contact hole through the dielectric layer and the second ferroelectric layer to allow metalization of the top electrode; and etching a contact hole through the dielectric layer and the first ferroelectric layer to allow metalization of the bottom electrode.

A second method of fabricating a ferroelectric capacitor according to the present invention includes the steps of: forming in sequence a bottom electrode layer, a first ferroelectric layer, and a top electrode layer; etching the top electrode layer to form a top electrode; etching the first ferroelectric layer; etching the bottom electrode layer to form a bottom electrode; forming a second ferroelectric layer over the first ferroelectric layer, thereby completely encapsulating the top electrode; etching the second ferroelectric layer so that the second ferroelectric layer overlaps the bottom electrode; forming a dielectric layer over the etched second ferroelectric layer; and etching contact holes through the dielectric layer and the second ferroelectric layer to allow metalization of the top and bottom electrodes.

A third method of fabricating a ferroelectric capacitor according to the present invention includes the steps of:

forming in sequence a bottom electrode layer, a first ferroelectric layer, and a top electrode layer; etching the top electrode layer to form a top electrode; etching the first ferroelectric layer; etching the bottom electrode layer to form a bottom electrode; forming a second ferroelectric layer over the first ferroelectric layer, thereby completely encapsulating the top electrode; forming a dielectric layer over the second ferroelectric layer; and etching contact holes through the dielectric layer and the second ferroelectric layer to allow metalization of the top and bottom electrodes.

A fourth method of fabricating a ferroelectric capacitor according to the present invention includes the steps of: forming in sequence a bottom electrode layer, a first ferroelectric layer of a first thickness, and a top electrode layer; etching the top electrode layer to form a top electrode; etching the first ferroelectric layer; forming a second ferroelectric layer of a second thickness over the first ferroelectric layer, thereby completely encapsulating the top electrode; etching the second ferroelectric layer and the bottom electrode layer to form a bottom electrode; forming a dielectric layer over the etched second ferroelectric layer; and etching contact holes through the dielectric layer and the second ferroelectric layer to allow metalization of the top and bottom electrodes.

A fifth method of fabricating a ferroelectric capacitor according to the present invention includes the steps of: forming in sequence a bottom electrode layer and a ferroelectric layer; partially etching the ferroelectric layer to form an indentation; forming a conformal top electrode layer over the ferroelectric layer; etching away the top electrode layer to form a top electrode in the indentation; etching the ferroelectric layer; etching the bottom electrode layer to form a bottom electrode; forming a dielectric layer over the etched ferroelectric layer; and etching contact holes through the dielectric layer to allow metalization of the top and bottom electrodes.

A sixth method of fabricating a ferroelectric capacitor according to the present invention includes the steps of: forming a bottom electrode layer; etching the bottom electrode layer to form a bottom electrode; forming a ferroelectric layer over the bottom electrode; partially etching the ferroelectric layer to form an indentation; forming a conformal top electrode layer over the ferroelectric layer; etching away the top electrode layer to form a top electrode in the indentation; forming a dielectric layer over the ferroelectric layer; etching a contact hole through the dielectric layer to allow metalization of the top electrodes; and etching a contact hole through the dielectric layer and the ferroelectric layer to allow metalization of the bottom electrode.

An integrated circuit ferroelectric memory cell having a bit line, a word line, and a plate line, fabricated according to the present invention includes: a silicon substrate or epitaxial region; a transistor formed in the substrate including first and second diffused regions, a thin gate oxide, and a gate forming the word line; a thick oxide layer formed on the substrate including contact holes to allow metalization of the first and second diffused regions; a ferroelectric capacitor formed on the thick oxide layer, the ferroelectric capacitor including a bottom electrode, a ferroelectric layer, and a top electrode, wherein the ferroelectric layer either partially or completely encapsulates the top electrode and includes a contact hole to allow metalization of the top electrode; a first dielectric layer formed over the thick oxide layer and the ferroelectric capacitor including contact holes to allow metalization of the first and second diffused regions, and the top and bottom electrodes of the ferroelectric capacitor; a first patterned metalization layer for contacting the first diffused region, for forming a local interconnect between the top electrode and the second diffused region, and for metalizing the bottom electrode; a second dielectric layer formed over the first metalization layer including contact holes to allow metalization of the first diffused region and the bottom electrode; a second patterned metalization layer for contacting the first diffused region to form the bit line, and for contacting the bottom electrode to form the plate line; and a passivation layer formed over the second metalization layer. If desired, the first dielectric layer, the second dielectric layer, and the passivation layer can each be formed as a ferroelectric layer for an even greater resistance to hydrogen degradation.

The foregoing and other objects, features and advantages of the invention will become more readily apparent from the following detailed description of a preferred embodiment of the invention which proceeds with reference to the accompanying drawings.

DETAILED DESCRIPTION

Referring now to FIGS. 3–9, sequential sectional views of a first ferroelectric capacitor process suitable for use in a ferroelectric memory having decreased hydrogen sensitivity are shown.

Figure 1:
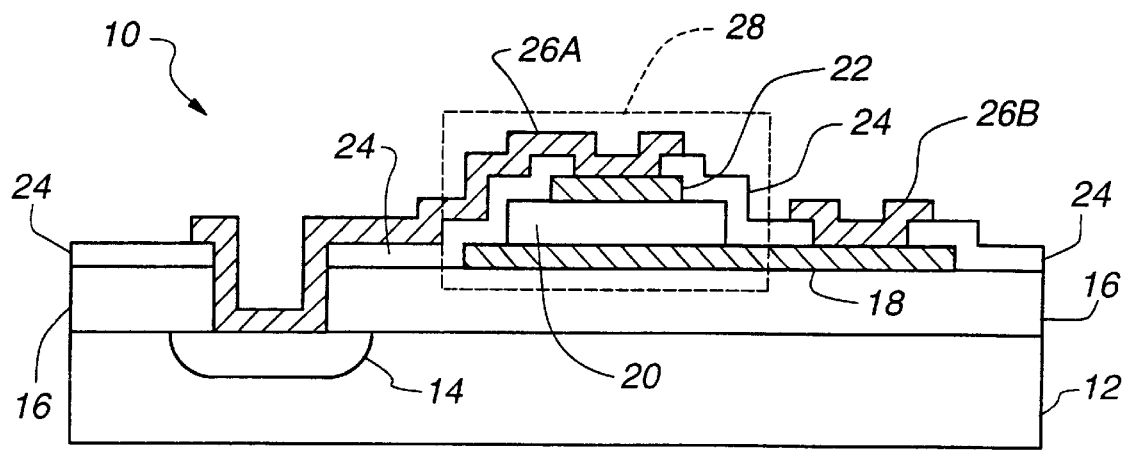
FIG. 1 is a sectional view of a portion of a prior art integrated circuit ferroelectric memory including a ferroelectric capacitor and a transistor.
Figure 2:
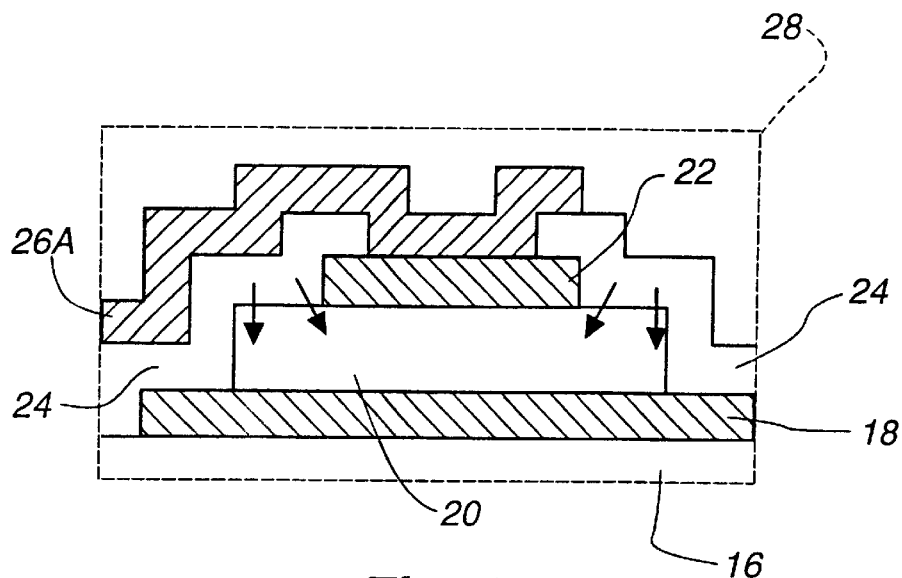
FIG. 2 is a magnified view of a prior art ferroelectric capacitor illustrating particularly the problem of hydrogen diffusion into the ferroelectric dielectric layer resulting in degradation of electrical switching performance.
Figure 3:
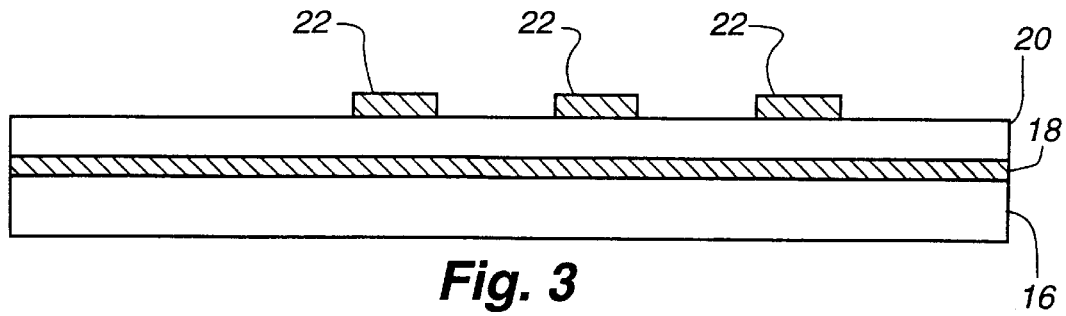
FIGS. 3–9 are sequential sectional views of a ferroelectric capacitor process suitable for use in a ferroelectric memory having decreased hydrogen sensitivity according to a first embodiment of the invention.

In FIG. 3, a layer 16 of BPSG glass about 7000 Angstroms thick is deposited onto a silicon or other substrate (not shown). Any oxide, nitride, or other appropriate dielectric layer can be substituted for BPSG layer 16. A platinum bottom electrode layer 18 is subsequently deposited over BPSG glass layer 16 to a thickness of about 1750 Angstroms. While platinum is used for electrode layer 16, other known materials compatible with ferroelectric films can be used including iridium, iridium oxide, and the like. The bottom electrode layer 18 also includes a titanium adhesion layer about 200 Angstroms thick to facilitate the adhesion of the platinum bottom electrode layer 18 to BPSG glass layer 16. A first ferroelectric layer 20 is subsequently deposited over the bottom electrode layer 18 to a thickness of about 3000 Angstroms. The material used in ferroelectric layer 20 is ideally doped or undoped PZT (lead zirconate titanate), SBT (strontium bismuth tantalate), or any other known ferroelectric material suitable for use in thin film form. After the ferroelectric layer 20 is deposited, a first anneal is performed. The first anneal includes a 650° C. heat treatment for about five seconds, followed by an 850° C. heat treatment for about five seconds.

A platinum top electrode layer 22 is subsequently deposited over the first ferroelectric layer 20 to a thickness of about 1750 Angstroms. The material used in top electrode layer 22 can be other than platinum as described above. Top electrode layer 22 is etched to form one or more top electrodes. Platinum is typically etched using a reactive-ion etch in an argon and chlorine atmosphere, although other gases can be used. Ion milling can be used as well as an alternative etching technique. The dimensions of the individual top electrodes can modified as desired from nominal dimensions of 1.5¥1.5 microns, with a spacing of about three microns between top electrodes. After the platinum top electrode layer 20 is etched to define the individual top electrodes, a second anneal is performed. The second anneal includes a 650° C. heat treatment for about sixty minutes in an oxygen atmosphere.

Figure 4:
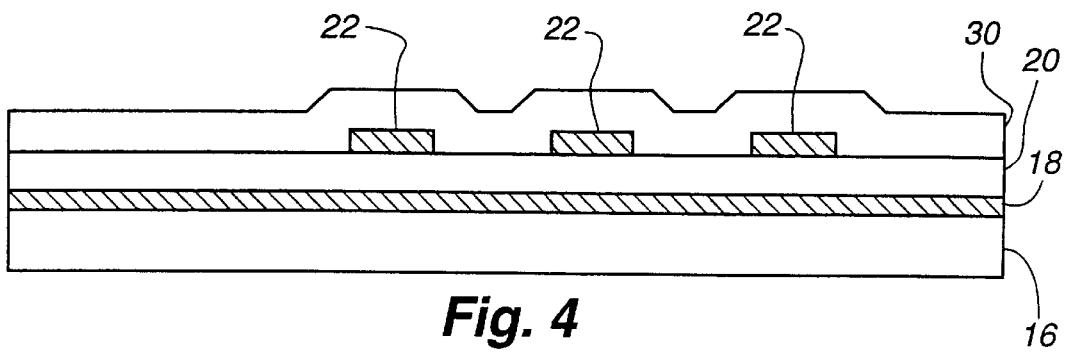

In FIG. 4, a second "cap" ferroelectric layer 30 about the same thickness (3000 Angstroms) as the first ferroelectric layer 20 is deposited over the first ferroelectric layer 20, thereby completely encapsulating the top electrodes 22. The material used in the second ferroelectric layer 30 is also ideally doped or undoped PZT (lead zirconate titanate), SBT (strontium bismuth tantalate), or any other known ferroelectric material suitable for use in thin film form. The first and second ferroelectric layers need not be the same ferroelectric material, since the second layer is used for its resistance to hydrogen diffusion or hydrogen "gettering" properties and not specifically for its ferroelectric properties. After the second ferroelectric layer 30 is deposited, an optional third anneal can be performed. The optional third anneal includes a 650° C. heat treatment for about sixty minutes in an oxygen atmosphere.

Figure 5:
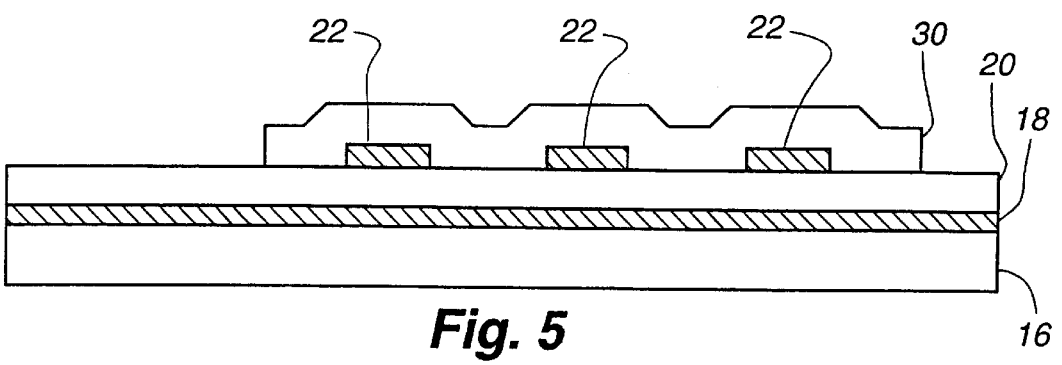

In FIG. 5, the second ferroelectric layer 30 is etched according to the same etching method as set forth for the first ferroelectric layer 20. The second ferroelectric layer 30 is etched to leave a reasonable overlap of the top electrodes 22, about 1.5 to 2.0 microns.

Figure 6:
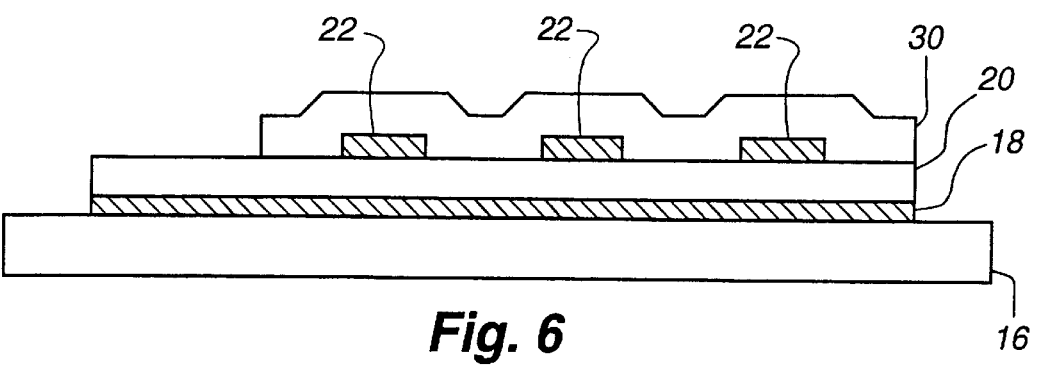

In FIG. 6, the first ferroelectric layer 20 and the bottom electrode layer 18 are simultaneously etched to define the dimensions of a bottom electrode. As can be seen in FIG. 6, one end of the bottom electrode 18 is etched to allow sufficient room for an eventual bottom electrode contact. The other end of bottom electrode 18 is etched to the same dimensions as the second ferroelectric layer 30. The first ferroelectric layer 20 and the bottom electrode layer 18 are simultaneously etched using a reactive-ion etch in an argon and carbon tetrafluoride atmosphere, although other gases can be used. Ion milling can also be used as an alternative etching technique. After the first ferroelectric layer 20 and bottom electrode layer 18 are etched, an optional first recovery anneal can be performed. The optional first recovery anneal includes a 550° C. heat treatment for about sixty minutes in an oxygen atmosphere.

Figure 7:
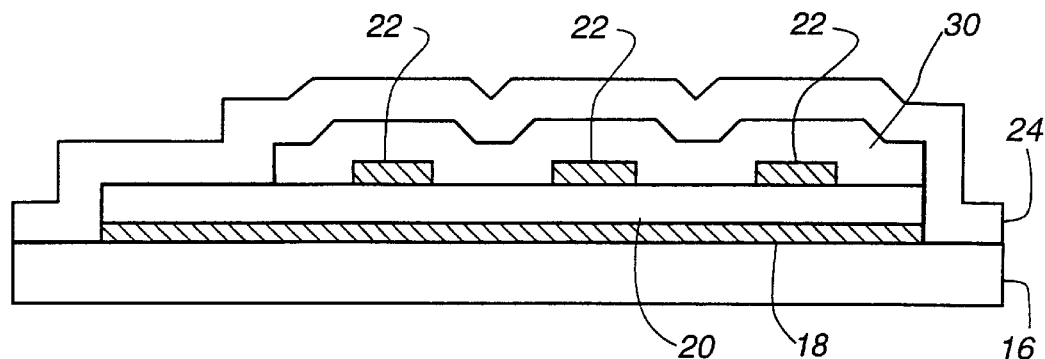

In FIG. 7, a PTEOS glass dielectric layer 24 is deposited over the etched first ferroelectric and second ferroelectric layers 20 and 30 to a thickness of about 5000 Angstroms. Other dielectric layers can be used for dielectric layer 24.

Figure 8:
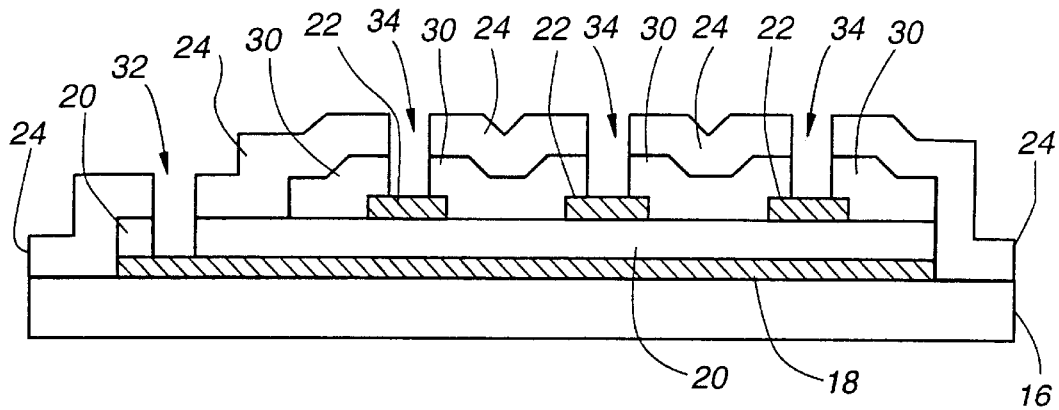

In FIG. 8, contact holes are etched to provide access of the top and bottom electrodes 22 and 18. Contact hole 32 provides access to bottom electrode 18, and contact holes 34 provide access to top electrodes 22. Contact holes 34 are etched through the dielectric layer 24 and the second ferroelectric layer 30 to allow metalization of the top electrodes. Contact hole 32 is etched through the dielectric layer 24 and the first ferroelectric layer 20 to allow metalization of bottom electrode 18. Note that the contact holes 32 and 34 are ideally etched in two steps. The first etching step removes the dielectric layer 24 in the contact holes. The dielectric oxide material can be etched away using a fluorine-based wet or dry etch. It is desirable that a sloped profile is etched into the contact holes. After the dielectric oxide material is removed, the remaining ferroelectric material in the contact hole is etched away according to the ferroelectric etch described above. Note in FIG. 8 that contact holes 32 and 34 are etched through about the same thickness of material, i.e. 5000 Angstroms of glass plus 3000 Angstroms of ferroelectric material. Therefore, the etching of contact holes 32 and 34 can be performed simultaneously. After contact holes 32 and 34 are etched, an optional second recovery anneal can be performed. The optional second recovery anneal includes a 550° C. heat treatment for about sixty minutes in an oxygen atmosphere.

Figure 9:
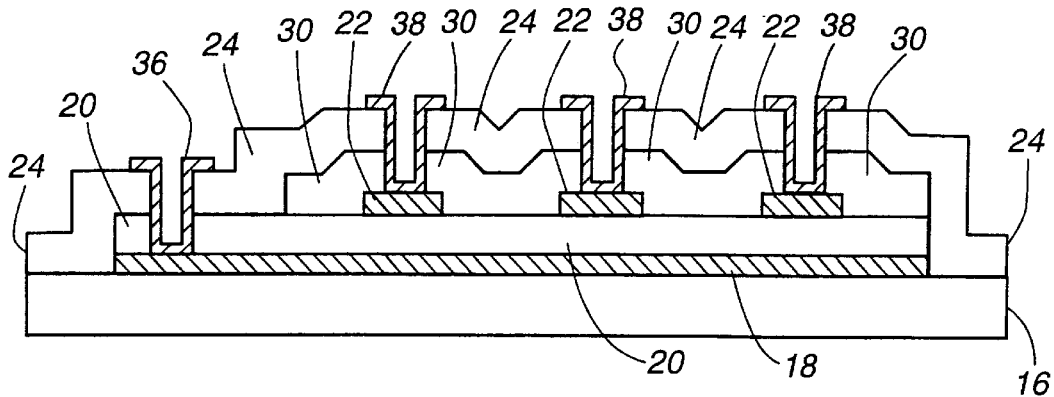
Figure 52:
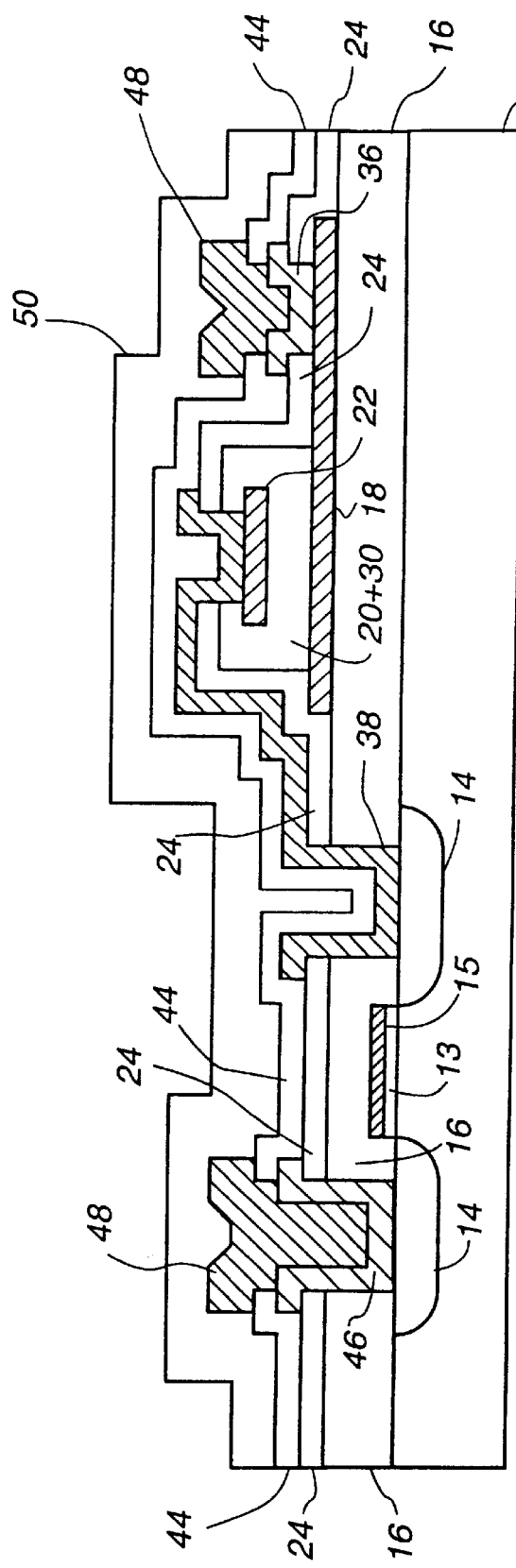
FIG. 52 is a sectional view of a completely metalized integrated circuit ferroelectric memory, in which the top electrode of the ferroelectric capacitor is completely encapsulated according to the present invention.

In FIG. 9, contact holes 32 and 34 are metalized to provide electrical access to bottom electrode 18 and top electrodes 22. A titanium nitride local interconnect metalization layer is deposited to a thickness of about 800 Angstroms and etched to form a metal contact 36 for bottom electrode 18 and a metal contact 38 for each of the top electrodes 22. The full metalization scheme showing subsequent oxide and metalization layers for a ferroelectric memory cell is shown in FIG. 52, although other metalization schemes can be used. For example, a titanium layer about 1500 Angstroms thick followed by an aluminum layer of about 8000 Angstroms thick can be used to form metal contacts 36 and 38. Other metalization techniques can be used as well after the titanium nitride layer has been deposited.

Figure 10:
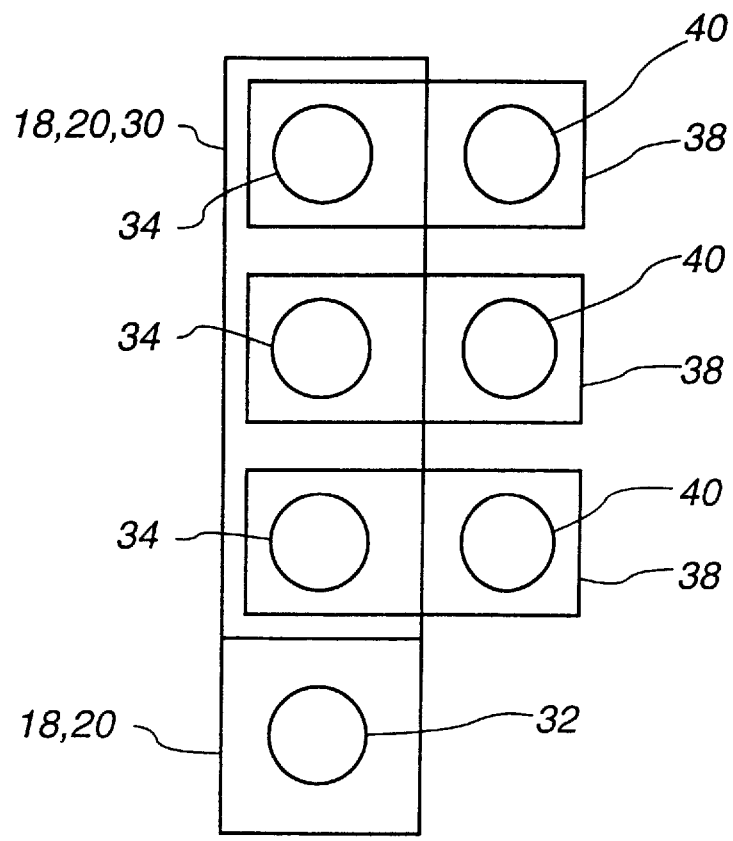
FIG. 10 is a plan view of a set of ferroelectric capacitors fabricated according to the process shown in FIGS. 3–9.

A plan view of the capacitor structure described above with respect to FIGS. 3–9 is shown in FIG. 10. The bottom electrode 18 and first ferroelectric layer 20 are shown as coincident layers forming a first rectangle. A second, smaller rectangle is formed of the bottom electrode 18, the first ferroelectric layer 20, and the second ferroelectric layer 30. The contact holes to the bottom and top electrodes 32 and 34 are shown as circular features. The local interconnect metal contact straps 38 that contact the top electrodes 22 are shown as individual rectangles overlapping contact holes 34 and 40. Contact holes 40 are not shown in FIGS. 3–9 but represent a contact to another structure such as the diffused region of a transistor as is shown in FIG. 52.

Referring now to FIGS. 11–17, sequential sectional views of a second ferroelectric capacitor process suitable for use in a ferroelectric memory having decreased hydrogen sensitivity are shown.

Figure 11:
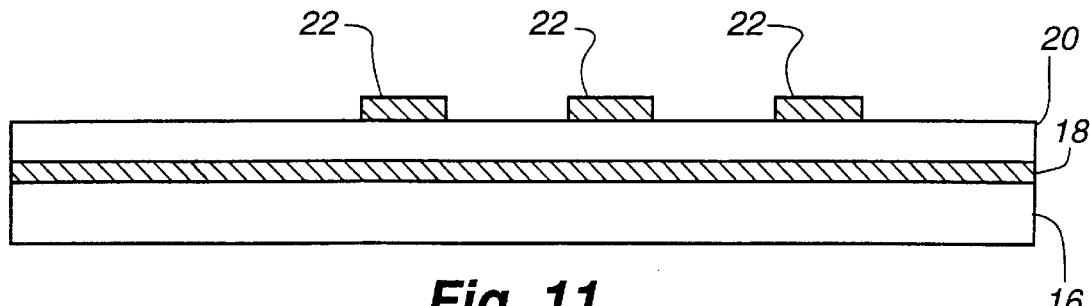
FIGS. 11–17 are sequential sectional views of a ferroelectric capacitor process suitable for use in a ferroelectric memory having decreased hydrogen sensitivity according to a second embodiment of the invention.

FIG. 11 is the same sectional view as FIG. 3, showing the sequential deposition of a thick glass layer 16, a bottom electrode layer 18, a first ferroelectric layer 20, and a top electrode layer 22. All of the thicknesses and materials described above are the same in FIG. 11. A first anneal can be performed after the first ferroelectric layer 18 is deposited. The platinum top electrode layer 22 is etched to form individual top electrodes 22. A second anneal can be performed after the top electrodes 22 are etched.

Figure 12:
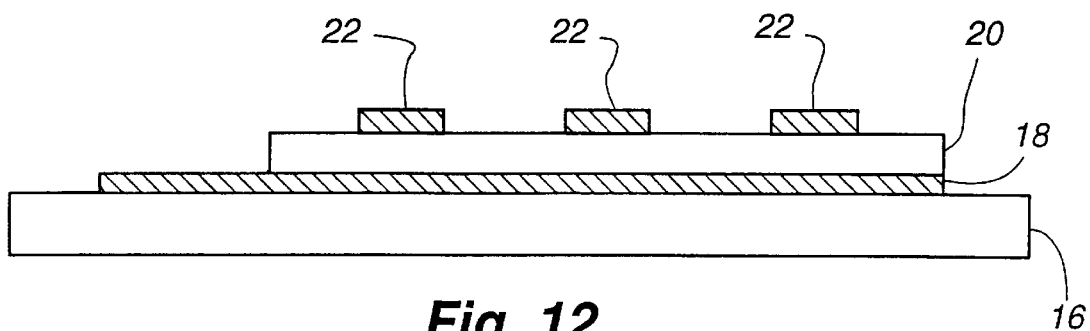

In FIG. 12, the first ferroelectric layer 20 is etched with some lateral overlap of the etched top electrodes 20. The bottom electrode layer 18 is etched to define the dimensions of a bottom electrode. As can be seen in FIG. 12, one end of the bottom electrode 18 is etched to allow sufficient room for the eventual bottom electrode contact. The other end of bottom electrode 18 is etched to the same dimensions as the first ferroelectric layer 20. The etching techniques for bottom electrode 18 and first ferroelectric layer 20 are as described above with reference to FIGS. 3–11. After the first ferroelectric layer 20 and bottom electrode layer 18 are etched, an optional first recovery anneal can be performed. The optional first recovery anneal includes a 550° C. heat treatment for about sixty minutes in an oxygen atmosphere.

Figure 13:
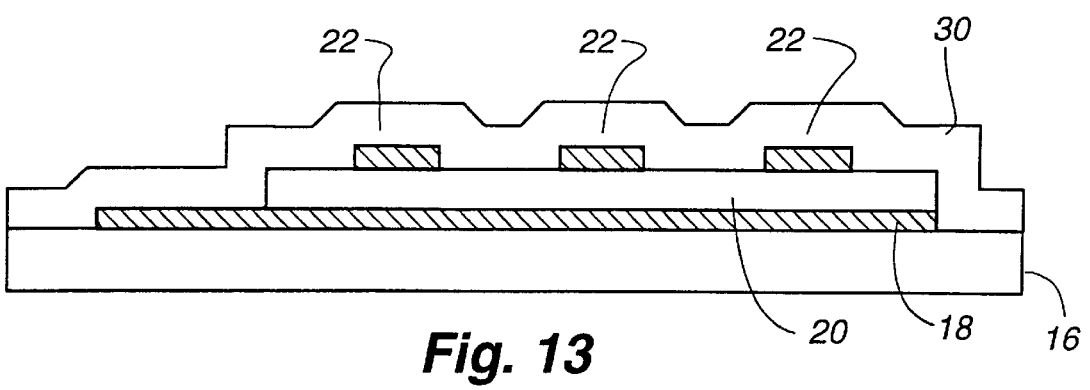

In FIG. 13, a second "cap" ferroelectric layer 30 about the same thickness (3000 Angstroms) as the first ferroelectric layer 20 is deposited over the first ferroelectric layer 20, thereby completely encapsulating the top electrodes 22. After the second ferroelectric layer 30 is deposited, an optional third anneal can be performed. The optional third anneal includes a 650° C. heat treatment for about sixty minutes in an oxygen atmosphere.

Figure 14:
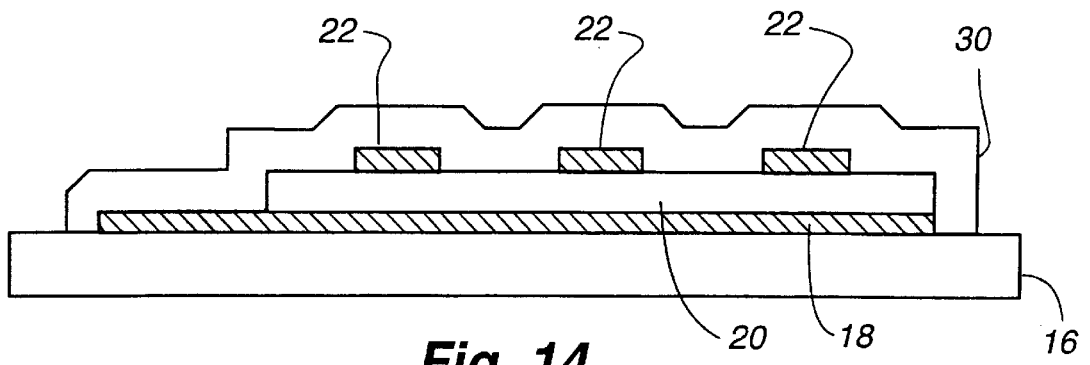

In FIG. 14, the second ferroelectric layer 30 is etched according to the same etching method as set forth for the first ferroelectric layer 20. The second ferroelectric layer 30 is etched to leave a reasonable overlap of the bottom electrode 18, about 1.5 to 2.0 microns. After the second ferroelectric layer 30 is etched, an optional second recovery anneal can be performed.

Figure 15:
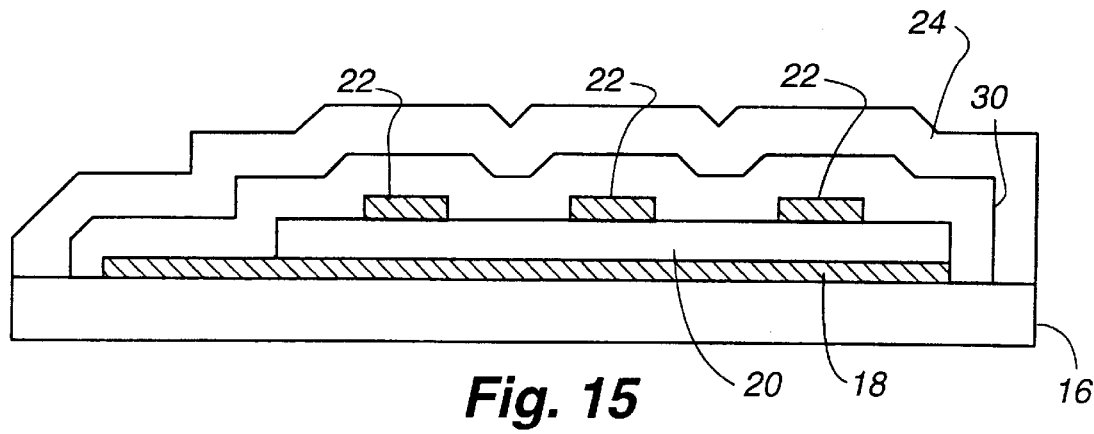

In FIG. 15, a PTEOS glass dielectric layer 24 is deposited over the etched second ferroelectric layers 30 to a thickness of about 5000 Angstroms.

Figure 16:
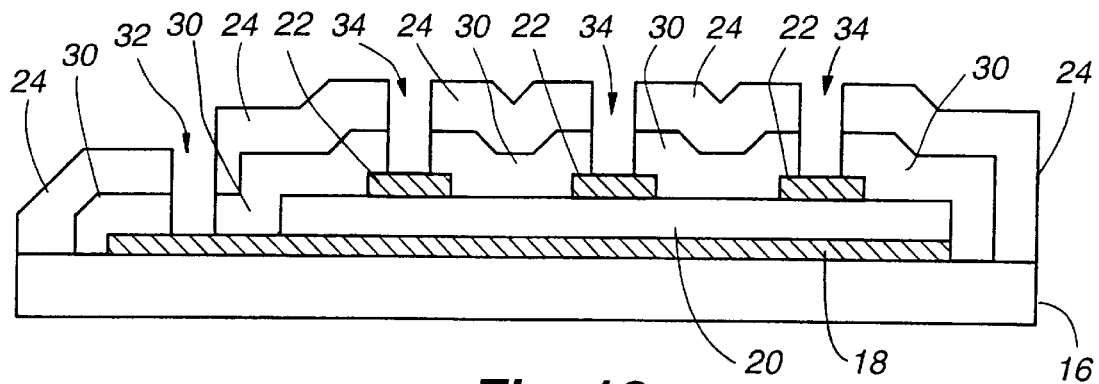

In FIG. 16, contact holes are etched to provide access of the top and bottom electrodes 22 and 18. Contact hole 32 provides access to bottom electrode 18, and contact holes 34 provide access to top electrodes 22. Note that in FIG. 16, both contact holes 34 and 36 are etched through the dielectric layer 24 and the second ferroelectric layer 30 to allow metalization of the top and bottom electrodes. The thickness of contact holes 34 and 36 is the same since they are etched through the same thickness of material. Contact holes 32 and 34 are ideally simultaneously etched in two steps to remove the dielectric oxide material and then the remaining ferroelectric material. The type of etch used in the same as described with reference to FIG. 8. After contact holes 32 and 34 are etched, an optional second recovery anneal can be performed.

Figure 17:
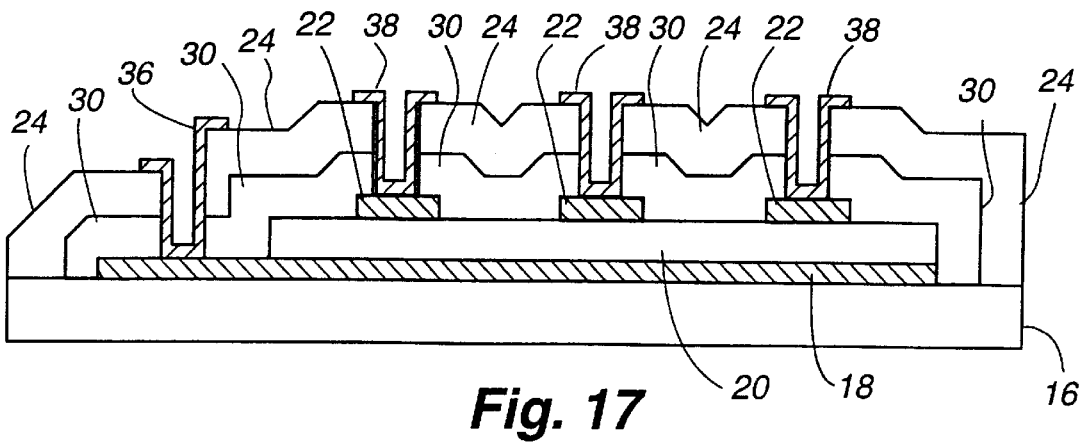

In FIG. 17, contact holes 32 and 34 are metalized to provide electrical access to bottom electrode 18 and top electrodes 22. A titanium nitride local interconnect metalization layer is deposited to a thickness of about 800 Angstroms and etched to form a metal contact 36 for bottom electrode 18 and a metal contact 38 for each of the top electrodes 22. The full metalization scheme showing subsequent oxide and metalization layers for a ferroelectric memory cell is shown in FIG. 52, although other metalization schemes can be used.

Figure 18:
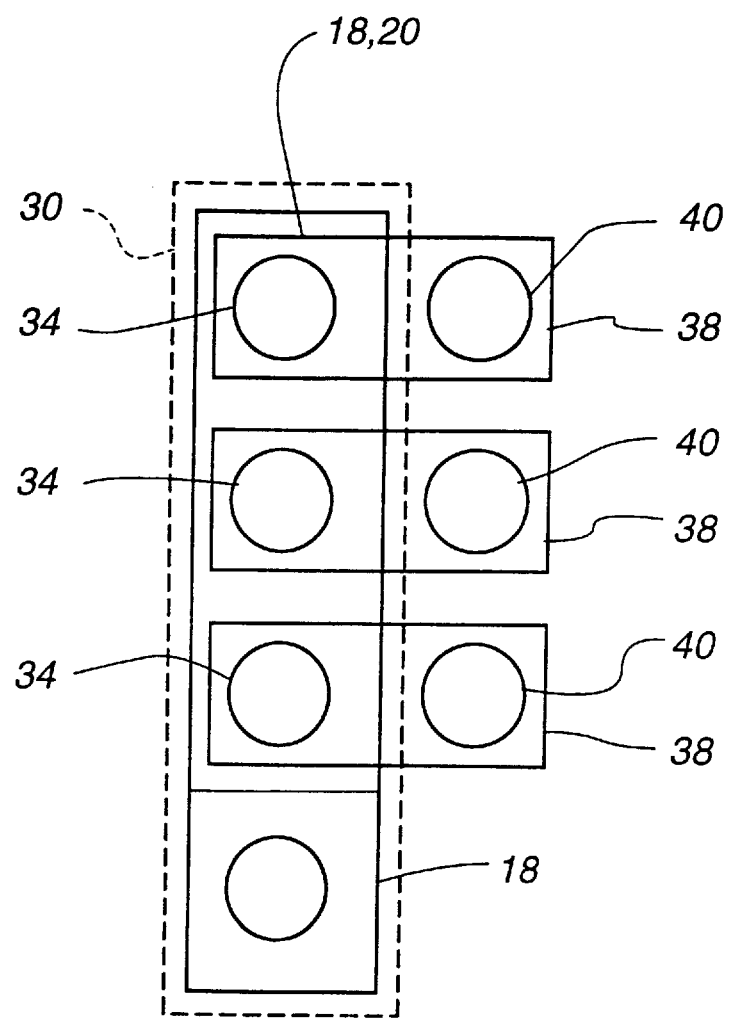
FIG. 18 is a plan view of a set of ferroelectric capacitor fabricated according to the process shown in FIGS. 11–17.

A plan view of the capacitor structure described above with respect to FIGS. 11–17 is shown in FIG. 18. The bottom electrode 18 is shown as forming a first rectangle. A second, smaller rectangle is formed of the bottom electrode 18 and the first ferroelectric layer 20. The second ferroelectric layer 30 is shown as a dashed rectangle overlapping the bottom electrode 18. The contact holes to the bottom and top electrodes 32 and 34 are shown as circular features. The local interconnect metal contact straps 38 that contact the top electrodes 22 are shown as individual rectangles overlapping contact holes 34 and 40. Contact holes 40 are not shown in FIGS. 11–17 but represent a contact to another structure such as the diffused region of a transistor as is shown in FIG. 52.

Referring now to FIGS. 19–24, sequential sectional views of a third ferroelectric capacitor process suitable for use in a ferroelectric memory having decreased hydrogen sensitivity are shown.

Figure 19:
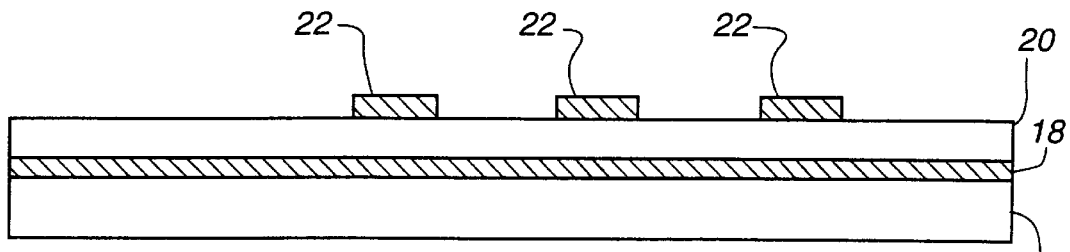
FIGS. 19–24 are sequential sectional views of a ferroelectric capacitor process suitable for use in a ferroelectric memory having decreased hydrogen sensitivity according to a third embodiment of the invention.
Figure 20:
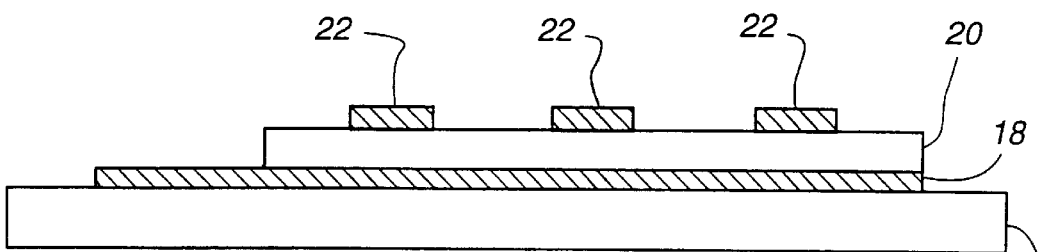
Figure 21:
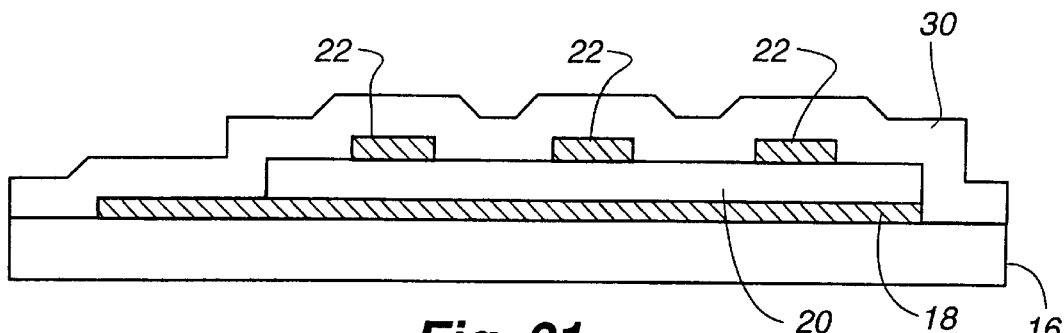

FIGS. 19–21 are identical to previously described FIGS. 11–13 both in sectional views, material, etching, and annealing steps. FIG. 19 shows a thick glass layer 16, a bottom electrode layer 18, a first ferroelectric layer 20, and a top electrode layer 22 formed in sequence, wherein the top electrode layer 22 is etched to form individual top electrodes 22. FIG. 20 shows the etching of the first ferroelectric layer 20 and the etching of the bottom electrode layer 18 to form a bottom electrode. In FIG. 21, a second "cap" ferroelectric layer 30 about the same thickness (3000 Angstroms) as the first ferroelectric layer 20 is deposited over the first ferroelectric layer 20, thereby completely encapsulating the top electrodes 22. A first anneal is performed after the ferroelectric layer 20 is deposited, a second anneal is performed after the top electrode layer 22 is etched, and an optional third anneal is performed after the second ferroelectric layer 30 is deposited. A optional first recovery anneal is performed after the first ferroelectric layer 20 and bottom electrode layer 18 have been etched.

Figure 22:
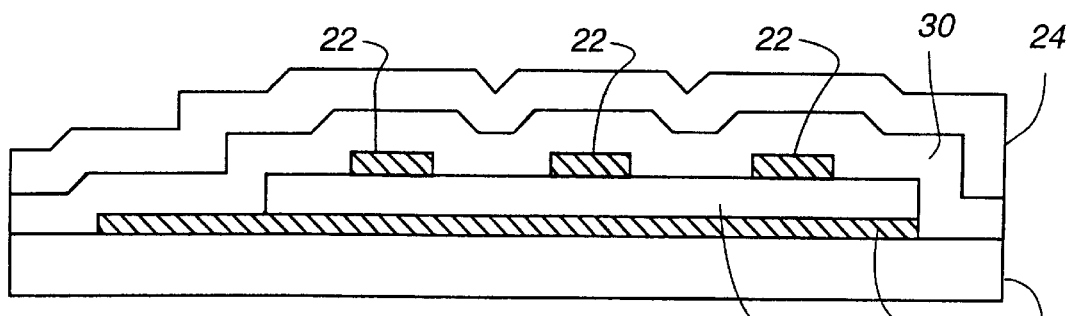

In FIG. 22, a PTEOS glass dielectric layer 24 is deposited over the unetched second ferroelectric layer 30 to a thickness of about 5000 Angstroms.

Figure 23:
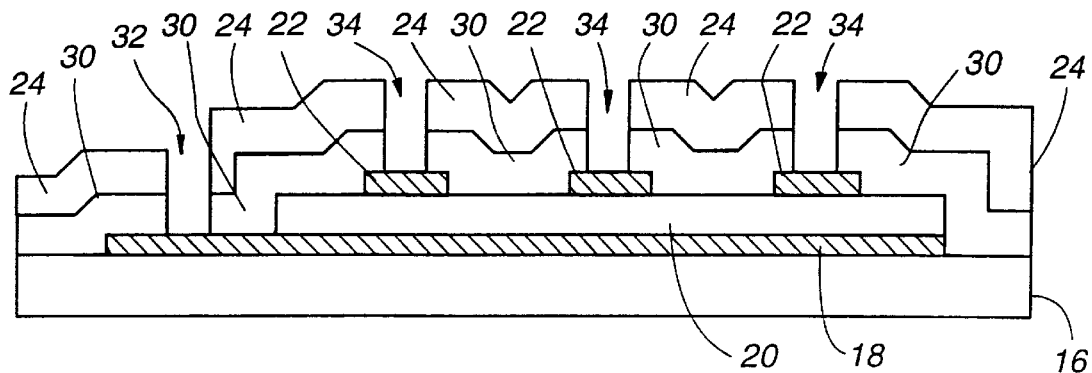

In FIG. 23, contact holes are etched to provide access of the top and bottom electrodes 22 and 18. Contact hole 32 provides access to bottom electrode 18, and contact holes 34 provide access to top electrodes 22. Note that in FIG. 23, both contact holes 34 and 36 are etched through the dielectric layer 24 and the second ferroelectric layer 30 to allow metalization of the top and bottom electrodes. The thickness of contact holes 34 and 36 is the same since they are etched through the same thickness of material. Contact holes 32 and 34 are ideally simultaneously etched in two steps to remove the dielectric oxide material and then the remaining ferroelectric material. The type of etch used in the same as described with reference to FIG. 8. A second optional recovery anneal can be performed after contact holes 32 and 34 have been opened.

Figure 24:
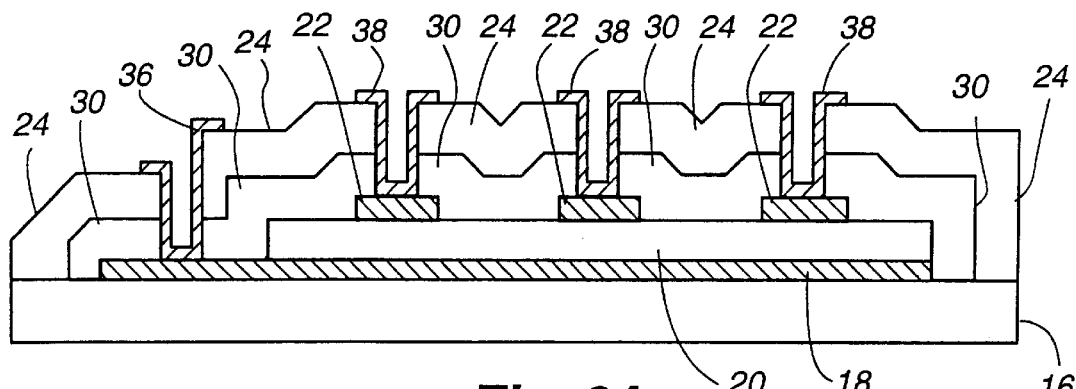

In FIG. 24, contact holes 32 and 34 are metalized to provide electrical access to bottom electrode 18 and top electrodes 22. A titanium nitride local interconnect metalization layer is deposited to a thickness of about 800 Angstroms and etched to form a metal contact 36 for bottom electrode 18 and a metal contact 38 for each of the top electrodes 22. The full metalization scheme showing subsequent oxide and metalization layers for a ferroelectric memory cell is shown in FIG. 52, although other metalization schemes can be used.

Figure 25:
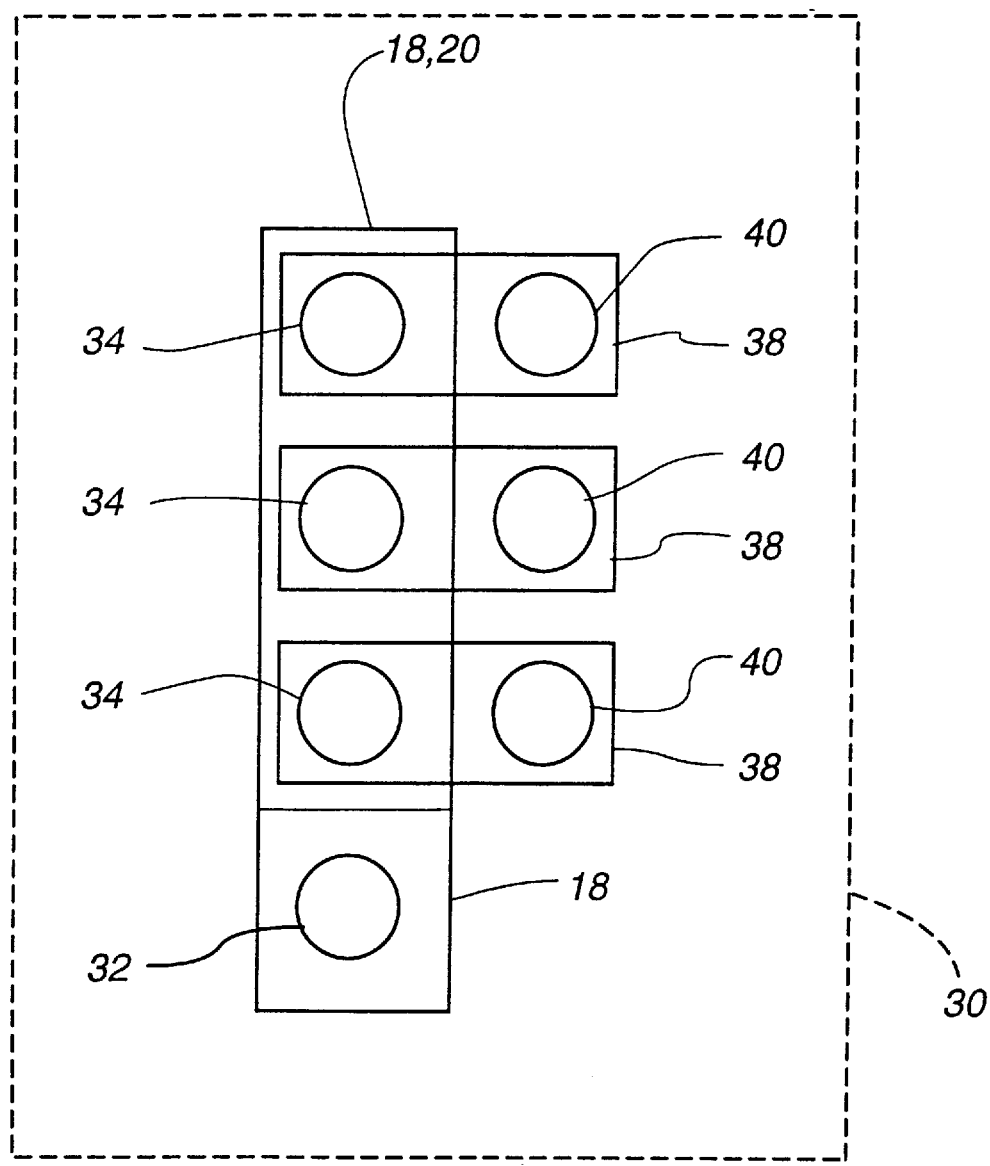
FIG. 25 is a plan view of a set of ferroelectric capacitor fabricated according to the process shown in FIGS. 19–24.

A plan view of the capacitor structure described above with respect to FIGS. 19–24 is shown in FIG. 25. The bottom electrode 18 is shown as forming a first rectangle. A second, smaller rectangle is formed of the bottom electrode 18 and the first ferroelectric layer 20. The second ferroelectric layer 30 is shown as a dashed rectangle overlapping the bottom electrode 18 by a wide margin. The wide margin shown is meant to convey the unetched, continuous extent of the second ferroelectric layer 30. The contact holes to the bottom and top electrodes 32 and 34 are shown as circular features. The local interconnect metal contact straps 38 that contact the top electrodes 22 are shown as individual rectangles overlapping contact holes 34 and 40. Contact holes 40 are not shown in FIGS. 19–24 but represent a contact to another structure such as the diffused region of a transistor as is shown in FIG. 52.

Referring now to FIGS. 26–32, sequential sectional views of a fourth ferroelectric capacitor process suitable for use in a ferroelectric memory having decreased hydrogen sensitivity are shown. The fourth ferroelectric capacitor process described below allows the thickness of the second ferroelectric layer 30 to be different from the first ferroelectric layer 20, if desired.

Figure 26:
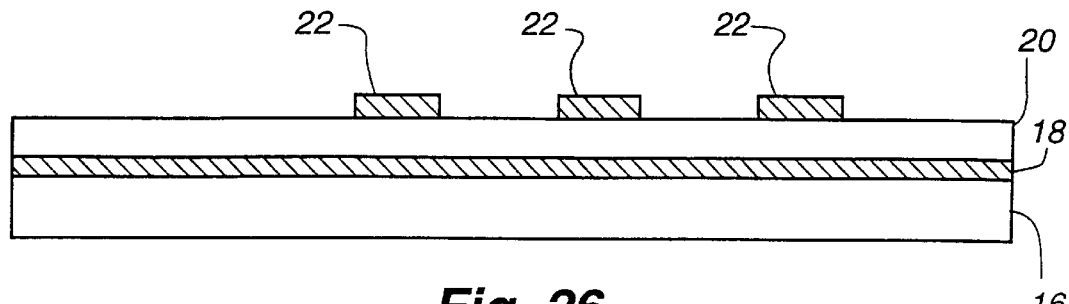
FIGS. 26–32 are sequential sectional views of a ferroelectric capacitor process suitable for use in a ferroelectric memory having decreased hydrogen sensitivity according to a fourth embodiment of the invention.

FIG. 26 is the same as previously described FIGS. 3, 11, and 19. A first anneal is performed after the first ferroelectric layer 20 is deposited, and a second anneal is performed after the top electrode layer 22 is etched.

Figure 27:
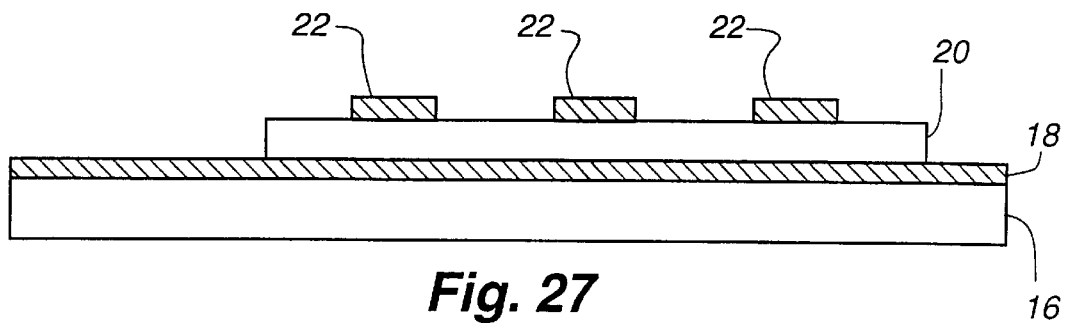

In FIG. 27, only the first ferroelectric layer 20 is etched to a reasonable overlap of the etched top electrodes 22. The bottom electrode layer 18 remains unetched in FIG. 27. An optional first recovery anneal is performed after the first ferroelectric layer 20 is etched.

Figure 28:
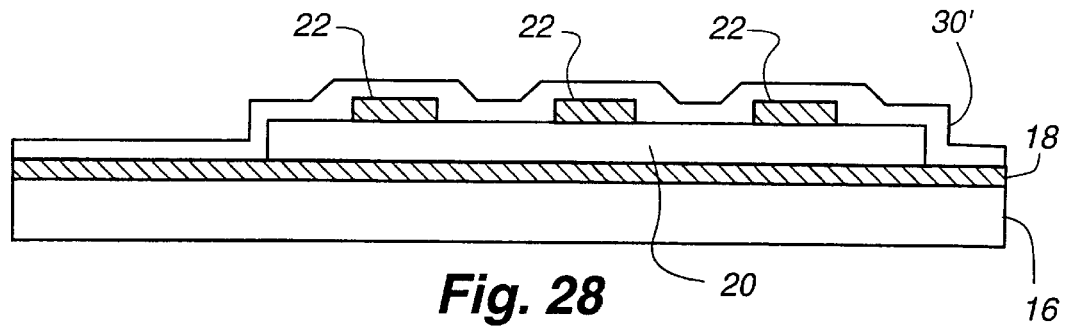

In FIG. 28, a second "cap" ferroelectric layer 30' of a different thickness (less than or greater than 3000 Angstroms) from the first ferroelectric layer 20 is deposited over the first ferroelectric layer 20, thereby completely encapsulating the top electrodes 22. A less thick second ferroelectric layer 30' is desirable since less material is used, it is easier to etch, more planar, and for other processing reasons. However, if desired, the same or a thicker ferroelectric layer 30' can be used. The material used for the second ferroelectric layer 30' is the same as described above, and can be different than the material used in the first ferroelectric layer 20. An optional third anneal can be performed after the second ferroelectric layer 30' is deposited.

Figure 29:
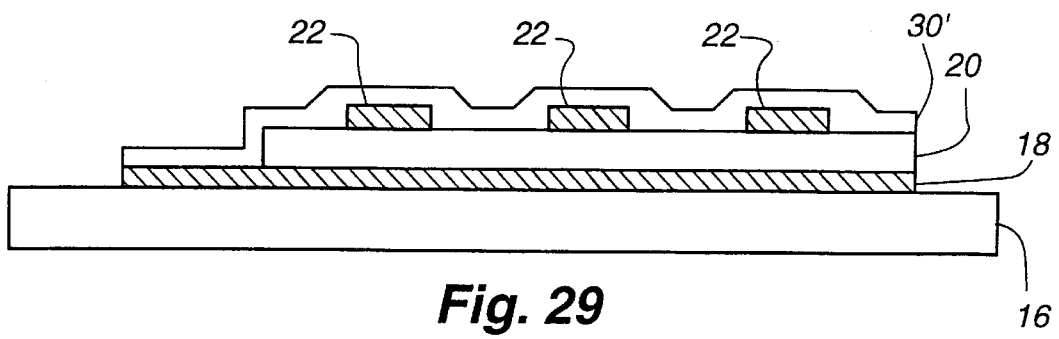

In FIG. 29, the second ferroelectric layer 30' and the bottom electrode layer 18 are simultaneously etched to form a bottom electrode. After the bottom electrode layer 18 and second ferroelectric layer 30' have been etched, an optional second recovery anneal can be performed.

Figure 30:
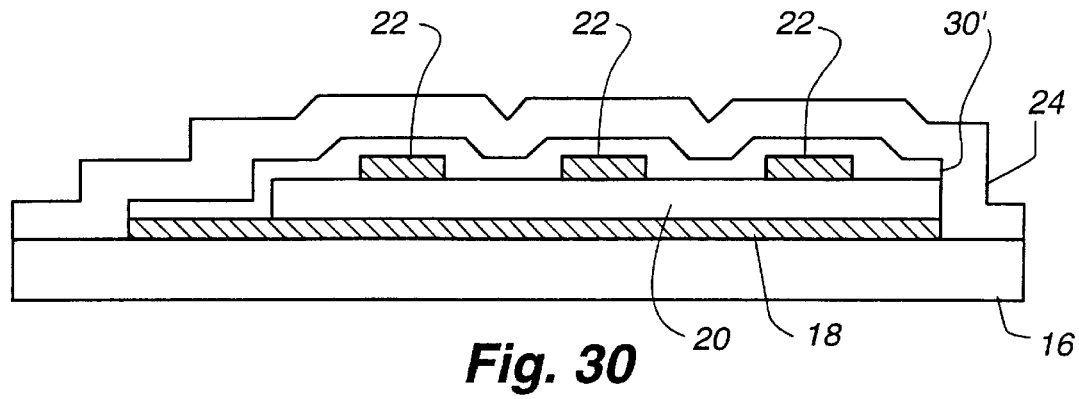

In FIG. 30, a PTEOS glass dielectric layer 24 is deposited over the etched second ferroelectric layer 30' to a thickness of about 5000 Angstroms.

Figure 31:
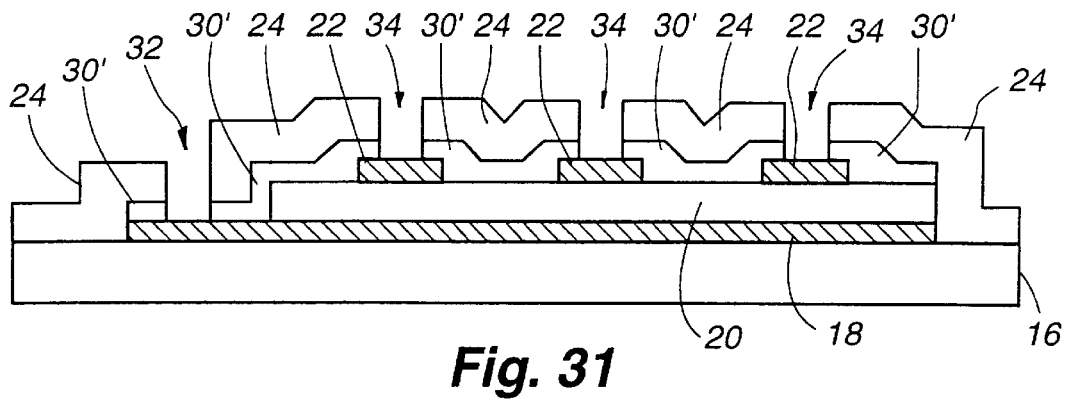

In FIG. 31, contact holes are etched to provide access of the top and bottom electrodes 22 and 18. Contact hole 32 provides access to bottom electrode 18, and contact holes 34 provide access to top electrodes 22. Note that in FIG. 31, both contact holes 34 and 36 are etched through the dielectric layer 24 and the second ferroelectric layer 30' to allow metalization of the top and bottom electrodes. The thickness of contact holes 34 and 36 is the same since they are etched through the same thickness of material. Contact holes 32 and 34 are ideally simultaneously etched in two steps to remove the dielectric oxide material and then the remaining ferroelectric material. The type of etch used in the same as described with reference to FIG. 8. After contact holes 32 and 34 have been etched, an optional third recovery anneal can be performed.

Figure 32:
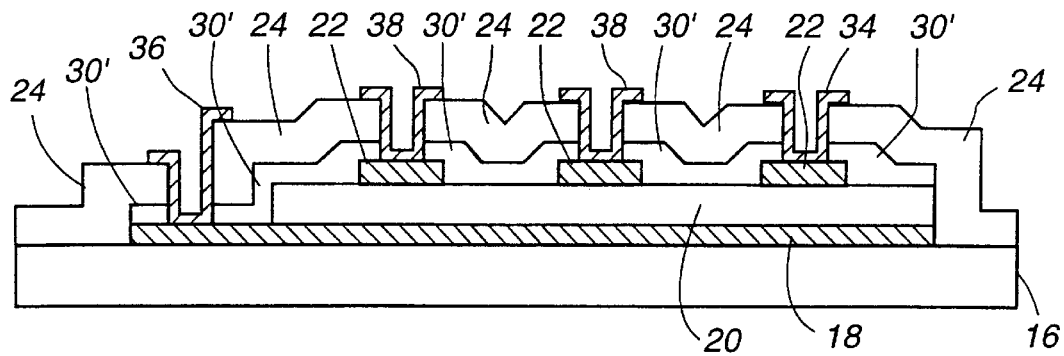

In FIG. 32, contact holes 32 and 34 are metalized to provide electrical access to bottom electrode 18 and top electrodes 22. The full metalization scheme showing subsequent oxide and metalization layers for a ferroelectric memory cell is shown in FIG. 52, although other metalization schemes can be used.

A plan view of the capacitor structure described above with respect to FIGS. 26–32 is not shown, but is similar to the plan view shown in FIG. 18. The one difference is that the second ferroelectric layer 30' does not overlap the bottom electrode 18, but is coincident thereto.

Referring now to FIGS. 33–41, sequential sectional views of a fifth ferroelectric capacitor process suitable for use in a ferroelectric memory having decreased hydrogen sensitivity are shown.

Figure 33:
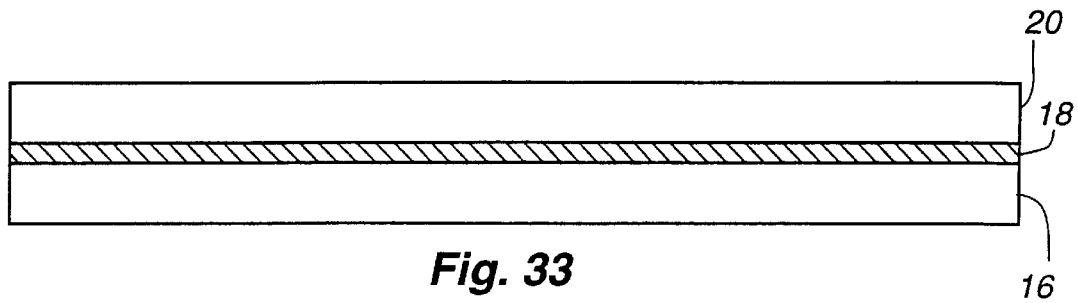
FIGS. 33–41 are sequential sectional views of a ferroelectric capacitor process suitable for use in a ferroelectric memory having decreased hydrogen sensitivity according to a fifth embodiment of the invention.

In FIG. 33, a layer 16 of BPSG glass about 7000 Angstroms thick is deposited onto a silicon or other substrate (not shown). A platinum bottom electrode layer 18 is subsequently deposited over BPSG glass layer 16 to a thickness of about 1750 Angstroms. The bottom electrode layer 18 also includes a titanium adhesion layer about 200 Angstroms thick to facilitate the adhesion of the platinum bottom electrode layer 18 to BPSG glass layer 16. A ferroelectric layer 20 is subsequently deposited over the bottom electrode layer 18 to a thickness of about 3000 Angstroms. The material used in ferroelectric layer 20 is ideally doped or undoped PZT (lead zirconate titanate), SBT (strontium bismuth tantalate), or any other known ferroelectric material suitable for use in thin film form.

Figure 34:
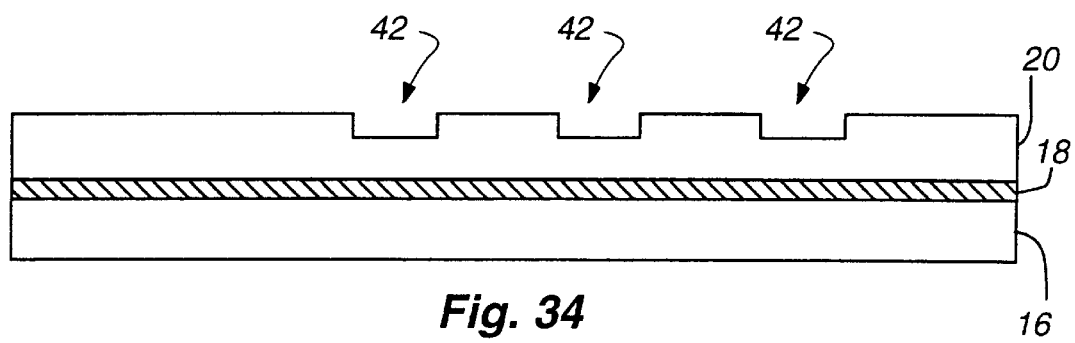

In FIG. 34 the ferroelectric layer 20 is partially etched to form one or more indentations 42. Indentations 42 should be etched to a sufficient depth to completely receive the top electrodes as is explained in further detail below. The etching technique used is the same reactive-ion etch used in etching the ferroelectric layers. After the ferroelectric layer 20 is partially etched, a first anneal is performed. The first anneal includes a 650° C. heat treatment for about five seconds, followed by an 850° C. heat treatment for about five seconds.

Figure 35:
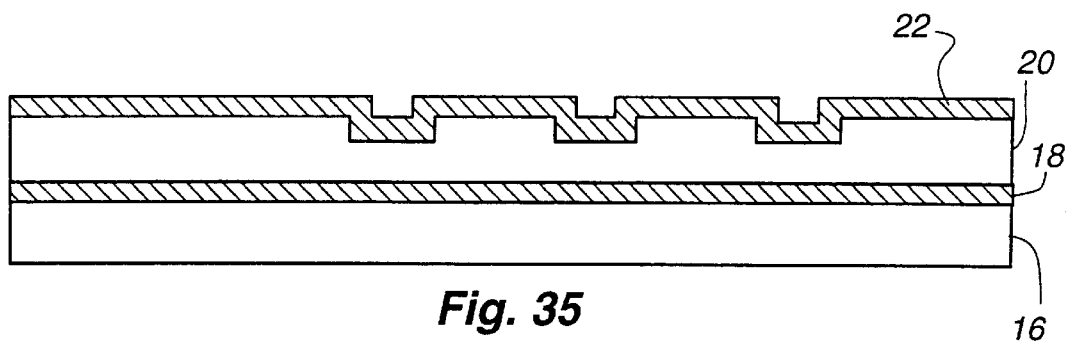

In FIG. 35, a platinum top electrode layer 22 is subsequently deposited over the ferroelectric layer 20 to a thickness of about 1750 Angstroms. The top electrode layer 22 is conformal and thus fills in each of the indentations 42.

Figure 36:
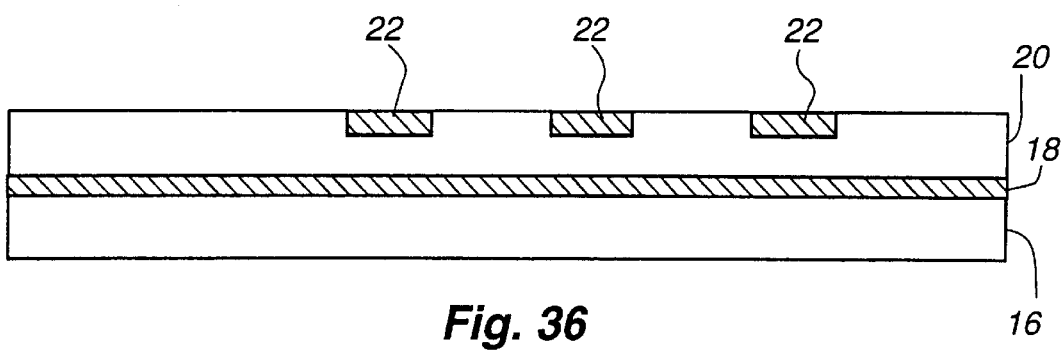

In FIG. 36, the top electrode layer 22 is etched away to form one or more top electrodes in indentations 42. Platinum is typically etched using a reactive-ion etch in an argon and chlorine atmosphere. Alternative etching techniques include ion milling or chemical mechanical polishing (CMP). The dimensions of the individual top electrodes can modified as desired from nominal dimensions of 1.5¥1.5 microns, with a spacing of about three microns between top electrodes. After the platinum top electrode layer 20 is etched to define the individual top electrodes, a second anneal is performed. The second anneal includes a 650° C. heat treatment for about sixty minutes in an oxygen atmosphere.

Figure 37:
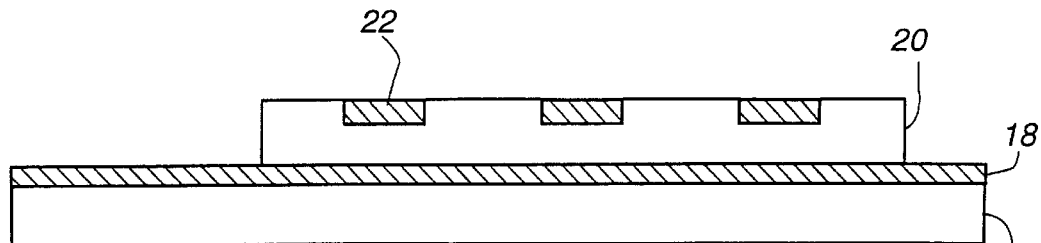

In FIG. 37, the ferroelectric layer 20 is etched to leave a reasonable lateral overlap of the top electrodes 22.

Figure 38:
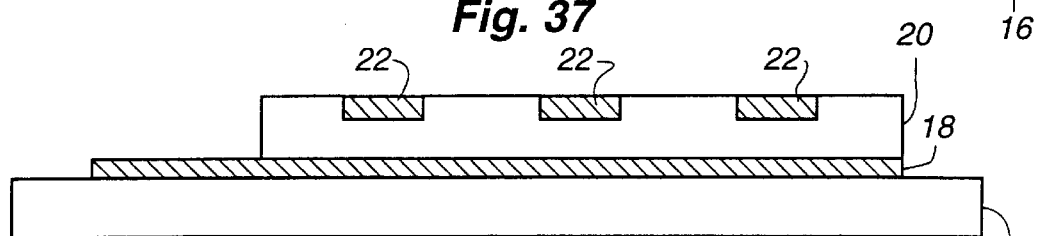

In FIG. 38, the bottom electrode layer 18 is etched to define the dimensions of a bottom electrode. As can be seen in FIG. 38, one end of the bottom electrode 18 is etched to allow room for an eventual bottom electrode contact. The other end of bottom electrode 18 is etched to the same dimensions as the second ferroelectric layer 30. The bottom electrode layer 18 is etched using a reactive-ion etch in an argon and chlorine atmosphere. After the bottom electrode layer 18 is etched, an optional first recovery anneal can be performed. The optional first recovery anneal includes a 550° C. heat treatment for about sixty minutes in an oxygen atmosphere.

Figure 39:
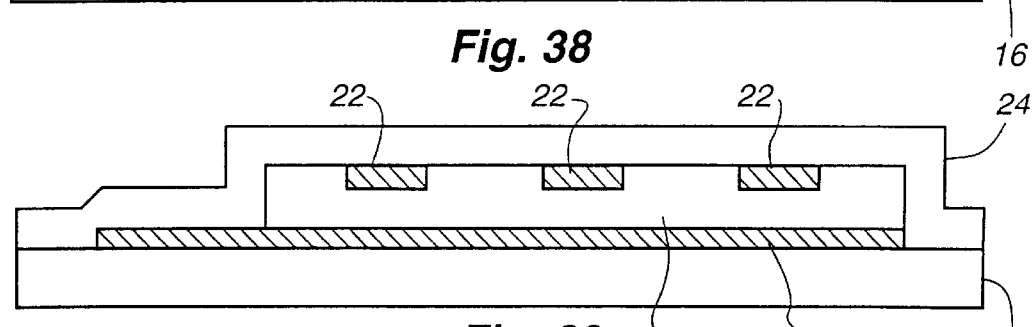

In FIG. 39, a PTEOS glass dielectric layer 24 is deposited over the etched ferroelectric layer 20 to a thickness of about 5000 Angstroms.

Figure 40:
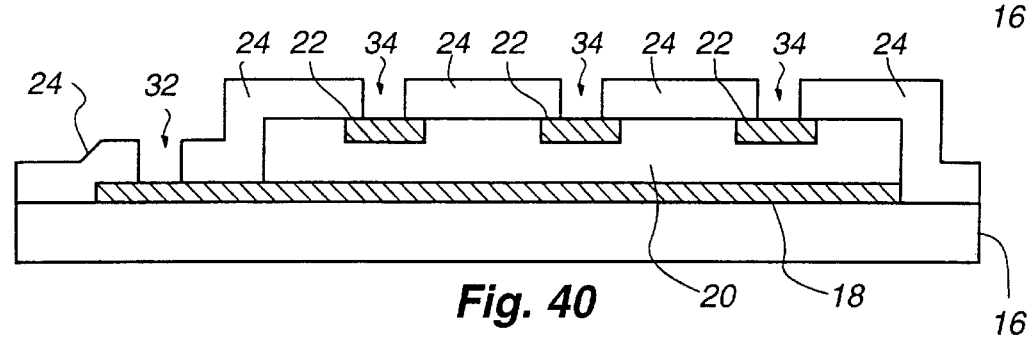

In FIG. 40, contact holes are etched to provide access of the top and bottom electrodes 22 and 18. Contact hole 32 provides access to bottom electrode 18, and contact holes 34 provide access to top electrodes 22. Contact holes 34 and 32 are etched through the dielectric layer 24 to allow metalization of the top electrodes and bottom electrodes 22 and 18. Note that the contact holes 32 and 34 are etched in a single etching step. The dielectric oxide material can be etched away using a fluorine-based wet or dry etch. It is desirable that a sloped profile is etched into the contact holes. Note in FIG. 40 that contact holes 32 and 34 are etched through about the same thickness of material, i.e. 5000 Angstroms of glass dielectric layer 24. A second optional recovery anneal can be performed after contact holes 32 and 34 are opened as previously described.

Figure 41:
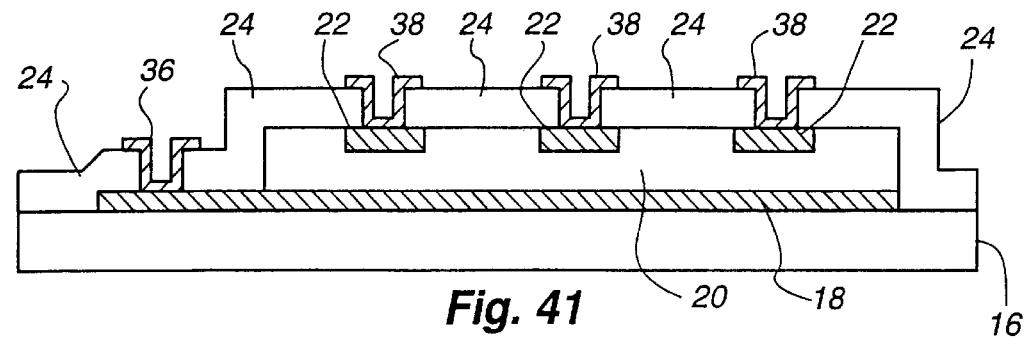

In FIG. 41, contact holes 32 and 34 are metalized to provide electrical access to bottom electrode 18 and top electrodes 22 as previously described above.

A plan view of the capacitor structure described above with respect to FIGS. 33–41 is similar to that shown in FIG. 10. The only difference is that there is no second level of ferroelectric material 30. The contours of the plan view, however, are the same.

Referring now to FIGS. 42–50, sequential sectional views of a sixth ferroelectric capacitor process suitable for use in a ferroelectric memory having decreased hydrogen sensitivity are shown.

Figure 42:
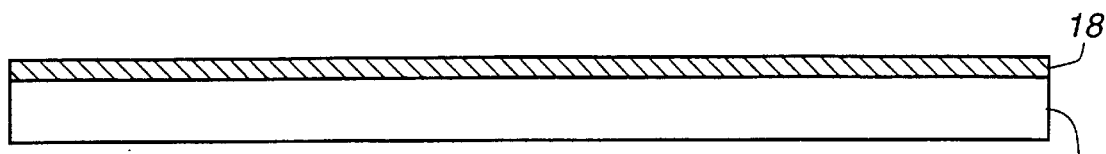
FIGS. 42–50 are sequential sectional views of a ferroelectric capacitor process suitable for use in a ferroelectric memory having decreased hydrogen sensitivity according to a sixth embodiment of the invention.

In FIG. 42, a layer 16 of BPSG glass about 7000 Angstroms thick is deposited onto a silicon or other substrate (not shown). A platinum bottom electrode layer 18 is subsequently deposited over BPSG glass layer 16 to a thickness of about 1750 Angstroms. The bottom electrode layer 18 also includes a titanium adhesion layer about 200 Angstroms thick to facilitate the adhesion of the platinum bottom electrode layer 18 to BPSG glass layer 16.

Figure 43:
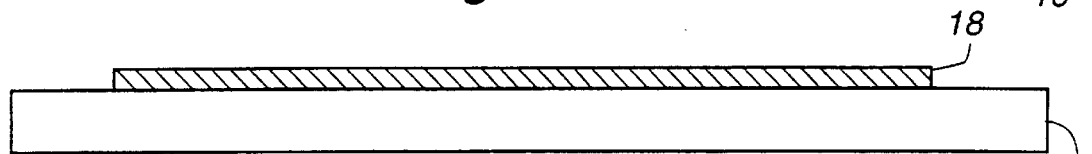

In FIG. 43, bottom electrode layer 18 is etched to form a bottom electrode.

Figure 44:
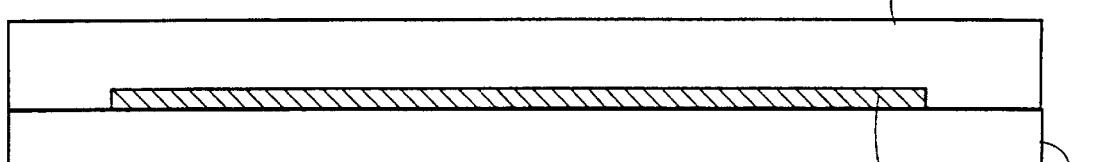

In FIG. 44, A ferroelectric layer 20 is subsequently deposited over the bottom electrode 18 to a thickness of about 3000 Angstroms. The material used in ferroelectric layer 20 is ideally doped or undoped PZT (lead zirconate titanate), SBT (strontium bismuth tantalate), or any other known ferroelectric material suitable for use in thin film form.

Figure 45:
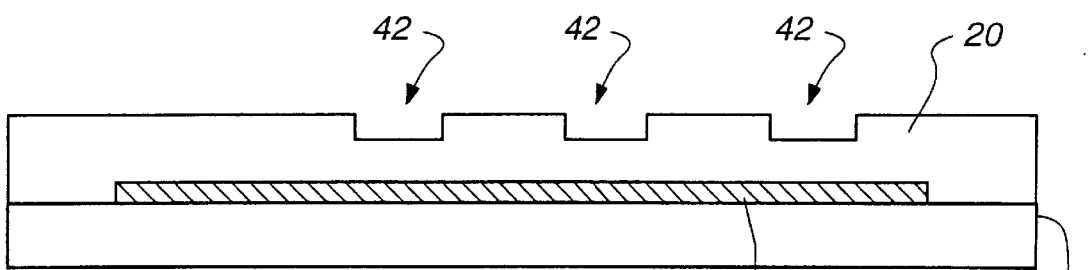

In FIG. 45 the ferroelectric layer 20 is partially etched to form one or more indentations 42. Indentations 42 should be etched to a sufficient depth to completely receive the top electrodes as is explained in further detail below. The etching technique used is the same reactive-ion etch used in etching the ferroelectric layers. After the ferroelectric layer 20 is partially etched, a first anneal is performed. The first anneal includes a 650° C. heat treatment for about five seconds, followed by an 850° C. heat treatment for about five seconds.

Figure 46:
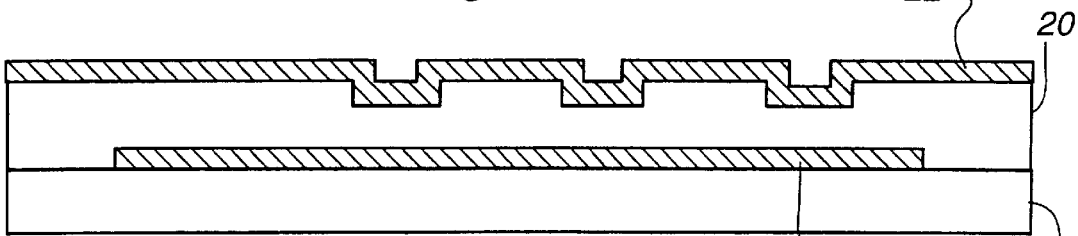

In FIG. 46, a platinum top electrode layer 22 is subsequently deposited over the ferroelectric layer 20 to a thickness of about 1750 Angstroms. The top electrode layer 22 is conformal and thus fills in each of the indentations 42.

Figure 47:
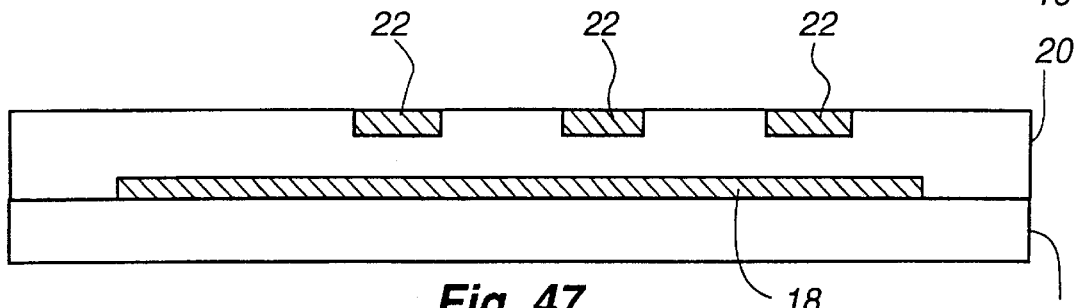

In FIG. 47, the top electrode layer 22 is etched away to form one or more top electrodes in indentations 42. Platinum is typically etched using a reactive-ion etch in an argon and chlorine atmosphere. The dimensions of the individual top electrodes can modified as desired from nominal dimensions of 1.5¥1.5 microns, with a spacing of about three microns between top electrodes. After the platinum top electrode layer 20 is etched to define the individual top electrodes, a second anneal is performed. The second anneal includes a 650° C. heat treatment for about sixty minutes in an oxygen atmosphere.

Figure 48:
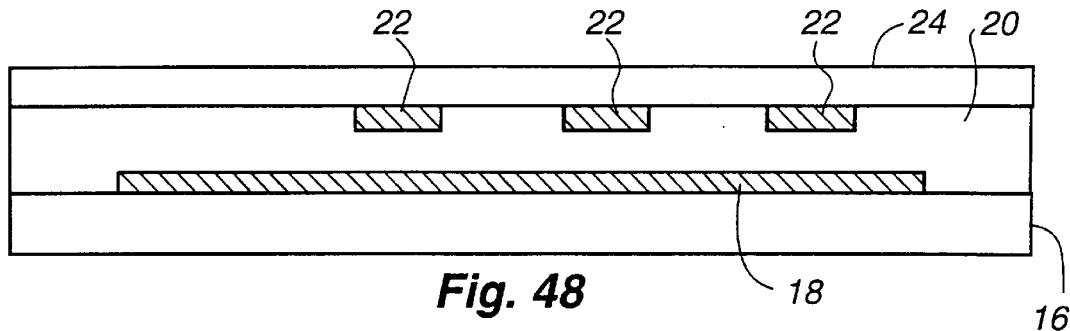

In FIG. 48, a PTEOS glass dielectric layer 24 is deposited over the etched ferroelectric layer 20 to a thickness of about 5000 Angstroms.

Figure 49:
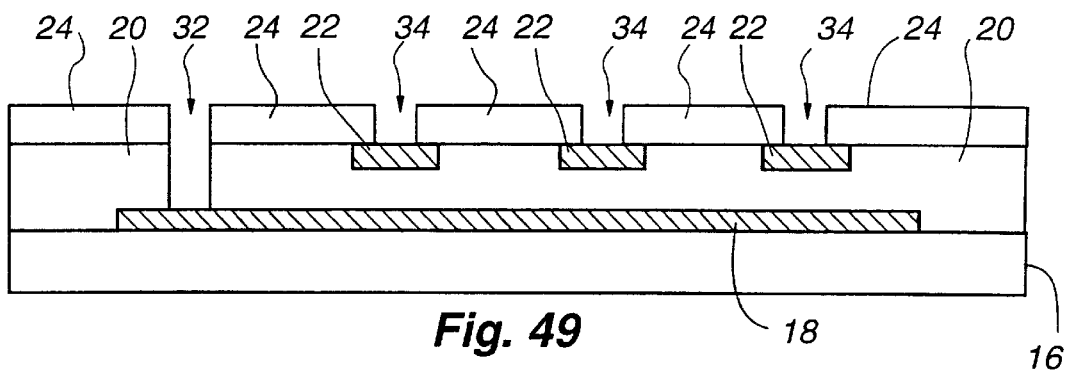

In FIG. 49, contact holes are etched to provide access of the top and bottom electrodes 22 and 18. Contact hole 32 provides access to bottom electrode 18, and contact holes 34 provide access to top electrodes 22. Contact holes 34 are etched through the dielectric layer 24 to allow metalization of the top electrodes 22. Contact hole 32, however is etched through dielectric layer 24 as well as ferroelectric layer 20. Note, therefore, that contact holes 32 and 34 are etched in two separate etching steps. The dielectric oxide material can be etched away using a fluorine-based wet or dry etch. The ferroelectric material is etched used a reactive-ion etch. It is desirable that a sloped profile is etched into the contact holes. An optional recovery anneal can be performed at this point in the process.

Figure 50:
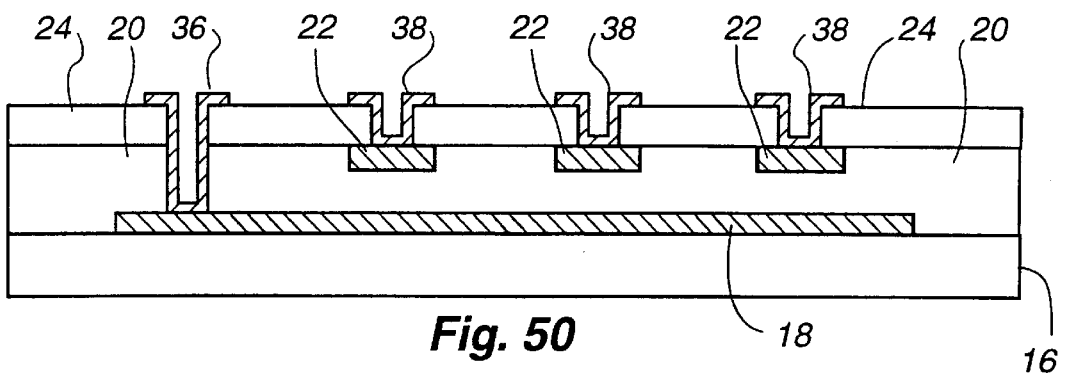

In FIG. 50, contact holes 32 and 34 are metalized to provide electrical access to bottom electrode 18 and top electrodes 22 as previously described above.

A plan view of the capacitor structure described above with respect to FIGS. 42–50 is similar to that shown in FIG. 25. The differences are that there is no second level of ferroelectric material 30, and the contour for ferroelectric material 20 should be removed.

Figure 51:
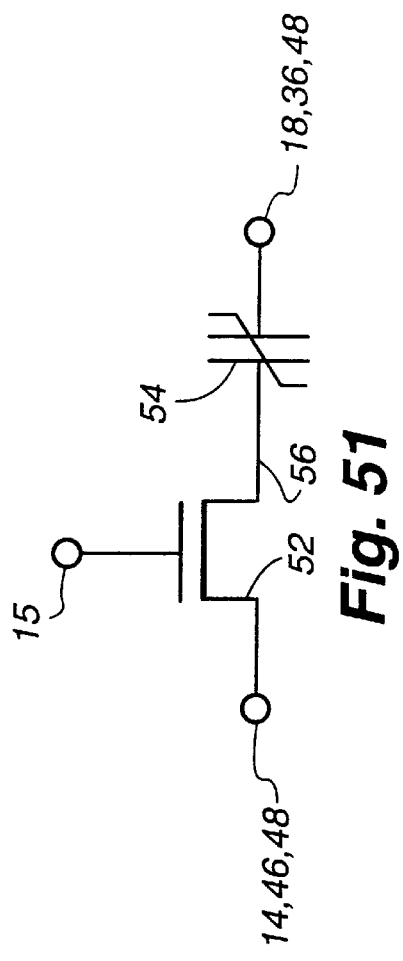
FIG. 51 is a schematic diagram of a ferroelectric memory cell having a transistor and a ferroelectric capacitor.

Referring now to FIG. 51, a schematic diagram for a typical non-volatile ferroelectric memory is shown having a transistor 52 coupled to a ferroelectric capacitor 54. The configuration in FIG. 51 is known as a one-transistor, one-capacitor ferroelectric memory cell or "1T/1C" cell. One current node of the transistor 52 forms the bit line of the cell, and is designated 14, 46, 48 to correspond to regions in the integrated cell shown below in FIG. 52. The other current node of transistor 52 is coupled to ferroelectric capacitor 54 at node 56. The gate 15 of transistor 52 forms the word line of the memory cell. One end of capacitor 54 is coupled to transistor 52 at node 56, and the other end of capacitor 54 forms the plate line of the memory cell. The plate line node is designated 18, 36, 48 to correspond to regions in the integrated cell shown below in FIG. 52.

Referring now to FIG. 52, a sectional view of a completely metalized integrated circuit ferroelectric memory cell having a bit line, a word line, and a plate line is shown. The memory cell includes a silicon substrate or epitaxial region 12, and a transistor formed in the substrate 12 including first and second diffused regions 14, a thin gate oxide 13, and a gate 15 forming the word line. A thick oxide layer 16 is formed on the substrate 12 including contact holes to allow metalization of the first and second diffused regions 14. Note that in FIG. 52, the exact sequence for forming each of the various layers and contact holes within each layer is not fully described; the contact holes may actually be formed at a subsequent processing step. A ferroelectric capacitor is subsequently formed on the thick oxide layer 16, including a bottom electrode 18, a ferroelectric layer 20+30, and a top electrode 22, wherein the ferroelectric layer 20+30 either partially or completely encapsulates the top electrode 22. The ferroelectric layer 20+30 includes a contact hole to allow metalization of the top electrode 22.

A first dielectric layer 24 is formed over the thick oxide layer 16 and the ferroelectric capacitor, including contact holes to allow metalization of the first and second diffused regions 14, and the top and bottom electrodes 22 and 18 of the ferroelectric capacitor. A first patterned metalization layer 36, 38, 46 is deposited for contacting the first diffused region 14 with metal contact 46, for forming a local interconnect 38 between the top electrode 22 and the second diffused region 14, and for metalizing the bottom electrode 36 with metal contact 36.

A second dielectric layer 44 is formed over the first metalization layer 36, 38, 46 including contact holes to allow metalization of the first diffused region 14 and the bottom electrode 36. A second patterned metalization layer 48 contacts the first diffused region 14 and forms the bit line of the memory cell, and contacts the bottom electrode 18 to form the plate line of the memory cell. Finally, a passivation layer 50 is formed over the second metalization layer 48.

Although the first and second dielectric layers 24 and 44 are typically thin doped or undoped oxide layers, if greater resistance to hydrogen diffusion is required these layers can also be made of ferroelectric materials such as PZT or SBT. Still further, the passivation layer 50, while typically formed of silicon nitride or the like, can also be made from ferroelectric materials such as PZT or SBT. All three layers mentioned above can be fabricated of the same or different ferroelectric materials as desired, and not necessarily the same material as used in the ferroelectric layer of the ferroelectric capacitor. Further teachings regarding ferroelectric material passivation can be found in U.S. Pat. No. 5,438,023 entitled "Passivation Method and Structure for a Ferroelectric Integrated Circuit using Hard Ceramic Materials or the Like", which is assigned to the assignee of the present invention, Ramtron International Corporation. While extra care can be taken to even further reduce sensitivity to hydrogen, these steps may increase fabrication costs and complexity.

Other Indicia of Improved Electrical Performance

The device structures according to the present invention provide a measure of immunity to line degradation associated with exposure to hydrogen during various processing steps. Additionally, it has been discovered that the method and structures of the present invention provide a significant improvement in several key ferroelectric performance parameters, as is explained in further detail below. Data supporting these discoveries is also provided below. The key ferroelectric performance parameters listed below are: opposite state charge; opposite state charge aging rate; V(90%), which is the voltage level at which the switched charge reaches about 90% of its final value; switched charge; and fatigued switched charge measured at some known number of switching cycles.

The improvement in the above-listed performance parameters was measured on a partially formed "unencapsulated" ferroelectric capacitor such as can be seen in FIGS. 1, 2, 3, 11, 12, 19, 20, 26, or 27, relative to the performance parameters measured on a fully formed, totally encapsulated ferroelectric capacitor such as can be seen in FIGS. 24, 32, or 52. For the partially encapsulated ferroelectric capacitors shown in FIGS. 33–41 and FIGS. 42–50, the improvement must be measured between an unencapsulated reference capacitor (the structure of which can be seen in FIG. 1 or FIG. 2, for example) of similar size to the fully formed, partially encapsulated ferroelectric capacitor. This is because, as can be seen from an inspection of FIGS. 33–41 and FIGS. 42–50, there is no partially formed unencapsulated ferroelectric capacitor whose base line performance can be measured.

At the present time, one of the theories deemed to be responsible for the improvement in electrical performance is a result of the presumed balancing of stresses at the interface of the top electrode and the dielectric ferroelectric layer located between the top and bottom electrodes. It is further believed that the balancing of stresses is due to the top electrode being constrained by the two ferroelectric layers that partially or totally encapsulate and bound it.

Figure 53:
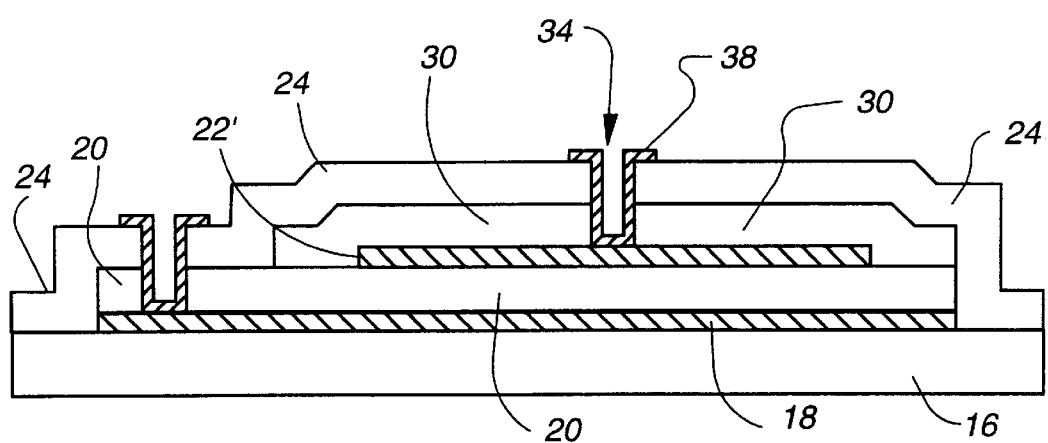
FIG. 53 is a cross sectional view of a discrete ferroelectric capacitor having a large top electrode used for testing purposes, but having a top electrode opening about the same area as that used for ferroelectric memory array capacitors.

Further corroboration of the stress reduction theory of improved electrical performance is described with respect to FIG. 53. FIG. 53 is a cross sectional diagram of a typical discrete ferroelectric capacitor used for testing purposes in which the area of the top electrode contact opening 34 is small with respect to the area of the large top electrode 22'. Memory array capacitors according to the present invention are shown in FIGS. 9, 17, 24, 32, 41, 50, and 52 in which the area of the contact opening 34 is the same as in FIG. 53. The area of the top electrode 22 in these figures, however, is much smaller than the top electrode 22' shown in FIG. 53, and the ratio of the area of the contact opening 34 to the area of the top electrode 22 is much greater. Studies and data confirm that the improvement in electrical performance is greater in the discrete ferroelectric capacitor of FIG. 53 than in the memory array ferroelectric capacitors shown in FIGS. 9, 17, 24, 32, 41, 50, and 52. In other words, the top electrode 22' of the discrete capacitor shown in FIG. 53 may be more constrained than the top electrodes 22 in the memory array capacitors.

Opposite State Charge. A crucial property of nonvolatile semiconductor memories, and ferroelectric memories in particular is retention in the absence of power. Retention is the ability to maintain a given data state between the time the data state is written and when it is subsequently read. A certain data state is written into a ferroelectric capacitor, or, in the case of a two-transistor, two-capacitor ("2T-2C") memory cell, a complementary data state. After a specified period of time, and at temperature, if desired, the data state is read to determine whether or not the original data state has been retained in the memory cell. Retention can be further characterized into an ability to maintain the same state (same state="SS") data or charge ($Q_{SS}$) and an ability to read the opposite state data (opposite state="OS") or charge ($Q_{OS}$) after maintaining an original data state for an extended period of time. Failure to maintain the same data state rarely occurs, and failures are usually related to operation at elevated temperatures near the Curie point in which the ferroelectric material tends to become paraelectric. A small $Q_{OS}$ charge indicates the failure of a ferroelectric memory cell to read an opposite data state. This failure mechanism is known as "imprint", and is frequently the source of failure in a ferroelectric memory. Imprint is the inability to maintain an opposite data state once an initial data state has been stored under time and temperature stress, i.e. the original data state is preferred or has been "imprinted" into the ferroelectric capacitor or film.

Opposite state charge has therefore been measured for two unencapsulated ferroelectric capacitors and extrapolated to 88 hours at 150° C. and compared against the opposite state charge for the same two capacitors in the completed, encapsulated form with the following results:

|  | Unencapsulated | Encapsulated |
| --- | --- | --- |
| Capacitor 1 | 9.45 micro-Coulombs | 26.3 micro-Coulombs |
| Capacitor 2 | 13.24 micro-Coulombs | 18.7 micro-Coulombs |

The total switched charge increased for both capacitors. Other related testing and studies confirm these results.

Opposite State Charge Aging Rate. Once the opposite state charge has been measured at various points in time, the rate at which this charge decays over time can also be easily calculated. This "opposite state charge aging rate", which is also known as imprint degradation, is also another important indicia of ferroelectric memory performance. The opposite state charge aging rate is calculated in percent of charge loss per natural decade of time. The calculated quantities have a negative value because opposite state charge decays with time and thus has a negative slope value.

Opposite state charge aging rate has therefore been calculated for two unencapsulated ferroelectric capacitors and compared against the opposite state charge aging rate for the same two capacitors in the completed, encapsulated form with the following results:

|  | Unencapsulated | Encapsulated |
| --- | --- | --- |
| Capacitor 1 | −15.1%/decade | −5.3%/decade |
| Capacitor 2 | −6.87%/decade | −4.7%/decade |

The aging rate, or slope of the opposite state charge decay, decreased for both capacitors. Other related testing and studies confirm these results.

The testing and measuring of opposite state charge and the associated aging rate is more fully explained and claimed in two co-pending patent applications assigned to Ramtron International Corporation entitled "The Use Of Calcium And Strontium Dopants To Improve Retention Performance In A PZT Ferroelectric Film", Ser. No. 08/616,856 and "A Method Of Measuring Retention Performance And Imprint Degradation Of Ferroelectric Films", Ser. No. 08/616,913, both of which are hereby incorporated by reference.

Figure 54:
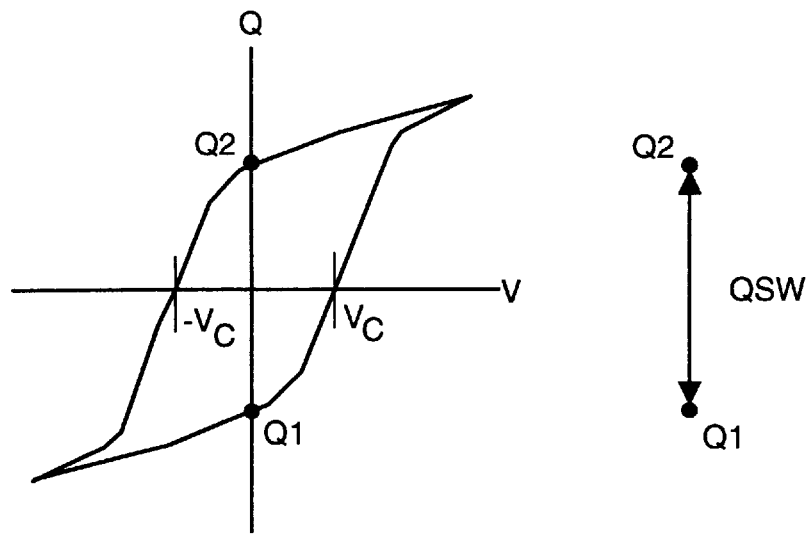
FIG. 54 is a hysteresis loop that illustrates the charge versus applied voltage switching behavior of a ferroelectric capacitor, particularly illustrating switched charge (QSW)
Figure 55:
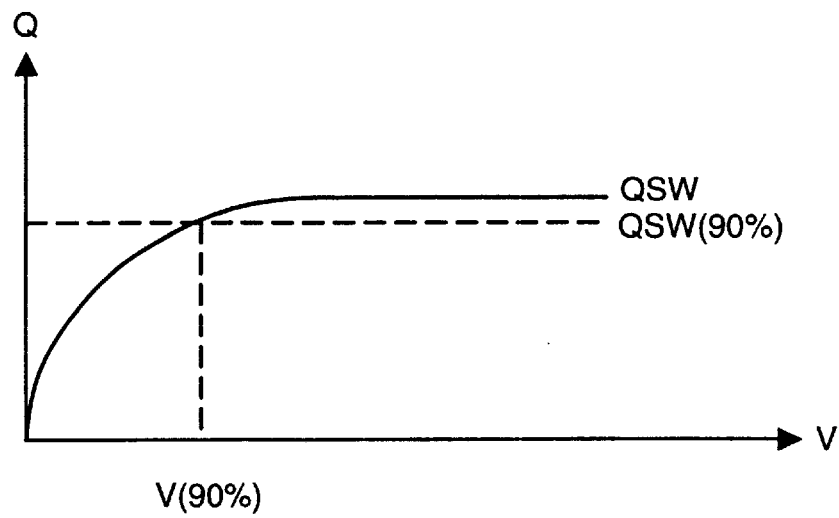
FIG. 55 is a graph of applied switching voltage level versus switched charge for a ferroelectric capacitor, particularly illustrating V(90%), or the voltage level at which switched charge attains about 90% of its final value.

V(90%). A further indicia of ferroelectric memory performance is termed "V(90%)" or the voltage at which the switched charge (QSW) reaches about 90% of its final value. Switched charge is the charge component measured between two charge points Q1 and Q2 on a hysteresis curve associated with a ferroelectric capacitor as is shown in FIG. 54. The V(90%) value can readily be ascertained by plotting switched charge versus the applied switching voltage level as is shown in FIG. 55. It is desirable that V(90%) be as low as possible. A low V(90%) voltage is correlated to acceptable low voltage memory performance.

The V(90%) has therefore been measured for two unencapsulated ferroelectric capacitors and compared against the V(90%) voltage for the same two capacitors in the completed, encapsulated form with the following results:

|  | Unencapsulated | Encapsulated |
| --- | --- | --- |
| Capacitor 1 | 4.73 volts | 4.15 volts |
| Capacitor 2 | 4.61 volts | 3.79 volts |

The V(90%) voltage decreased for both capacitors. Other related testing and studies confirm these results.

Switched Charge. Switched charge, described above with reference to FIG. 54, was measured with an applied external five volt switching pulse. Switched charge was measured for two unencapsulated ferroelectric capacitors and compared against the switched charge for the same two capacitors in the completed, encapsulated form with the following results:

|  | Unencapsulated | Encapsulated |
| --- | --- | --- |
| Capacitor 1 | 36.44 micro-Coulombs | 42.57 micro-Coulombs |
| Capacitor 2 | 25.77 micro-Coulombs | 33.79 micro-Coulombs |

The switched charge increased for both capacitors. Other related testing and studies confirm these results.

Fatigued Switched Charge. Fatigued switched charge, which is switched charge after the capacitor under test has been repeatedly switched between two polarization states, was measured with an applied external five volt switching pulse after $10^9$ switching cycles. Fatigued switched charge was measured for two unencapsulated ferroelectric capacitors and compared against the fatigued switched charge for the same two capacitors in the completed, encapsulated form with the following results:

|  | Unencapsulated | Encapsulated |
| --- | --- | --- |
| Capacitor 1 | 19.69 micro-Coulombs | 24.14 micro-Coulombs |
| Capacitor 2 | 13.83 micro-Coulombs | 27.48 micro-Coulombs |

The fatigued switched charge increased for both capacitors. Other related testing and studies confirm these results.

Having described and illustrated the principles of the invention in a preferred embodiment thereof, it is appreciated by those having skill in the art that the invention can be modified in arrangement and detail without departing from such principles. For example, the following aspects of the semiconductor processes described herein can be changed as required: the types of dielectric materials; the thicknesses of the various layers; the types of ferroelectric materials; the etching processes; the electrode materials; and the anneal temperatures, durations, and numbers. Also, the specific application of the ferroelectric capacitor of the present invention is not limited to ferroelectric memory cells, although it is ideally suited to that application. We therefore claim all modifications and variation coming within the spirit and scope of the following claims.

We claim:

1. A fabrication method comprising the steps of:

forming an unencapsulated ferroelectric capacitor including a bottom electrode, a top electrode, and a ferroelectric layer between the top and bottom electrodes;

extending the ferroelectric layer to completely encapsulate the top electrode with a sufficient ferroelectric layer thickness to reduce the sensitivity of the ferroelectric capacitor to hydrogen such that the opposite state charge relative to the opposite state charge of the unencapsulated ferroelectric capacitor is increased by a ratio of at least 1.412; and forming a contact hole to allow metalization of the top electrode.

2. The method of claim 1 in which the step of extending the ferroelectric layer comprises the step of forming an additional ferroelectric layer about 3000 Angstroms thick.

3. A fabrication method comprising the steps of:

forming an unencapsulated ferroelectric capacitor including a bottom electrode, a top electrode, and a ferroelectric layer between the top and bottom electrodes;

extending the ferroelectric layer to completely encapsulate the top electrode with a sufficient ferroelectric layer thickness to reduce the sensitivity of the ferroelectric capacitor to hydrogen such that the opposite state charge aging rate relative to the opposite state charge aging rate of the unencapsulated ferroelectric capacitor is decreased by at least 2.17 percent per decade; and forming a contact hole to allow metalization of the top electrode.

4. The method of claim 3 in which the step of extending the ferroelectric layer comprises the step of forming an additional ferroelectric layer about 3000 Angstroms thick.

5. A fabrication method comprising the steps of:

forming an unencapsulated ferroelectric capacitor including a bottom electrode, a top electrode, and a ferroelectric layer between the top and bottom electrodes;

extending the ferroelectric layer to completely encapsulate the top electrode with a sufficient ferroelectric layer thickness to reduce the sensitivity of the ferroelectric capacitor to hydrogen such that the voltage at which the switched charge reaches about 90% of its final value relative to the voltage at which the switched charge reaches about 90% of its final value of the unencapsulated ferroelectric capacitor is decreased by at least 0.58 volts; and forming a contact hole to allow metalization of the top electrode.

6. The method of claim 5 in which the step of extending the ferroelectric layer comprises the step of forming an additional ferroelectric layer about 3000 Angstroms thick.

7. A fabrication method comprising the steps of:

forming an unencapsulated ferroelectric capacitor including a bottom electrode, a top electrode, and a ferroelectric layer between the top and bottom electrodes;

extending the ferroelectric layer to completely encapsulate the top electrode with a sufficient ferroelectric layer thickness to reduce the sensitivity of the ferroelectric capacitor to hydrogen such that the switched charge relative to the switched charge of the unencapsulated ferroelectric capacitor is increased by a ratio of at least 1.168; and forming a contact hole to allow metalization of the top electrode.

8. The method of claim 7 in which the step of extending the ferroelectric layer comprises the step of forming an additional ferroelectric layer about 3000 Angstroms thick.

9. A fabrication method comprising the steps of:

including a bottom electrode, a top electrode, and a ferroelectric layer between the top and bottom electrodes;

extending the ferroelectric layer to completely encapsulate the top electrode with a sufficient ferroelectric layer thickness to reduce the sensitivity of the ferroelectric capacitor to hydrogen such that the fatigued switched charge at a predetermined number of switching cycles relative to the fatigued switched charge for the same number of switching cycles of the unencapsulated ferroelectric capacitor is increased by a ratio of at least 1.226; and forming a contact hole to allow metalization of the top electrode.

10. The method of claim 9 in which the step of extending the ferroelectric layer comprises the step of forming an additional ferroelectric layer about 3000 Angstroms thick.

* * * * *